(12) United States Patent
Kinzer et al.

(10) Patent No.: US 12,334,421 B2
(45) Date of Patent: Jun. 17, 2025

(54) THERMALLY ENHANCED ELECTRONIC PACKAGES FOR GaN POWER INTEGRATED CIRCUITS

(71) Applicant: Navitas Semiconductor Limited, Dublin (IE)

(72) Inventors: Daniel M. Kinzer, El Segundo, CA (US); Jason Zhang, Monterey Park, CA (US); Thomas Ribarich, Laguna Beach, CA (US)

(73) Assignee: Navitas Semiconductor Limited, Dublin (IE)

( * ) Notice: Subject to any disclaimer, the term of this patent is extended or adjusted under 35 U.S.C. 154(b) by 72 days.

(21) Appl. No.: 17/448,324

(22) Filed: Sep. 21, 2021

(65) Prior Publication Data

US 2022/0102251 A1    Mar. 31, 2022

Related U.S. Application Data

(63) Continuation of application No. 17/169,304, filed on Feb. 5, 2021, now Pat. No. 11,145,579.

(Continued)

(51) Int. Cl.
    *H01L 23/495*    (2006.01)
    *H01L 23/00*     (2006.01)
    *H01L 25/16*     (2023.01)

(52) U.S. Cl.
    CPC ........ *H01L 23/49575* (2013.01); *H01L 24/48* (2013.01); *H01L 24/73* (2013.01);
    (Continued)

(58) Field of Classification Search
    CPC ... H01L 23/49575; H01L 24/48; H01L 24/73; H01L 25/16; H01L 2224/48245;
    (Continued)

(56) References Cited

U.S. PATENT DOCUMENTS 6,396,137 B1  5/2002  Klughart
7,250,672 B2  7/2007  Cerezo et al.
(Continued)

FOREIGN PATENT DOCUMENTS

CN    106663669 A    5/2017
CN    110168718 A    8/2019
(Continued)

OTHER PUBLICATIONS

"Definition of Regulator and Regulate", merriam-webster.com, 2022, 2 pages.
(Continued)

*Primary Examiner* — Robert G Bachner
(74) *Attorney, Agent, or Firm* — FisherBroyles, LLP

(57) ABSTRACT

An electronic power conversion component includes an electrically conductive package base comprising a source terminal, a drain terminal, at least one I/O terminal and a die-attach pad wherein the source terminal is electrically isolated from the die-attach pad. A GaN-based semiconductor die is secured to the die attach pad and includes a power transistor having a source and a drain, wherein the source is electrically coupled to the source terminal and the drain is electrically coupled to the drain terminal. A plurality of wirebonds electrically couple the source to the source terminal and the drain to the drain terminal. An encapsulant is formed over the GaN-based semiconductor die, the plurality of wirebonds and at least a top surface of the package base.

20 Claims, 17 Drawing Sheets

Related U.S. Application Data

(60) Provisional application No. 63/077,526, filed on Sep. 11, 2020.

(52) U.S. Cl.
CPC .... *H01L 25/16* (2013.01); *H01L 2224/48245* (2013.01); *H01L 2224/73265* (2013.01); *H01L 2924/1033* (2013.01); *H01L 2924/1425* (2013.01)

(58) Field of Classification Search
CPC ... H01L 2224/73265; H01L 2924/1033; H01L 2924/1425; H01L 23/49541; H01L 24/06; H01L 24/13; H01L 24/37; H01L 24/49; H01L 2224/04042; H01L 2224/05554; H01L 2224/0616; H01L 2224/13101; H01L 2224/1329; H01L 2224/371; H01L 2224/45124; H01L 2224/45139; H01L 2224/45144; H01L 2224/45147; H01L 2224/48091; H01L 2224/4811; H01L 2224/48137; H01L 2224/48145; H01L 2224/48247; H01L 2224/48257; H01L 2224/49052; H01L 2224/49113; H01L 2224/4917; H01L 2224/49171; H01L 2224/49431; H01L 2924/00014; H01L 2924/10253; H01L 2924/12035; H01L 2924/1306; H01L 2924/1426; H01L 2924/181; H01L 23/3677; H01L 23/49562
See application file for complete search history.

(56) References Cited

U.S. PATENT DOCUMENTS

| | | | |
|---|---|---|---|
| 9,214,415 B2 | 12/2015 | Denison et al. | |
| 9,659,845 B2 | 5/2017 | Fernando et al. | |
| 9,929,079 B2 | 3/2018 | Kinzer | |
| 10,355,475 B2 | 7/2019 | Kinzer | |
| 11,145,579 B1 | 10/2021 | Kinzer et al. | |
| 11,652,062 B2 | 5/2023 | Parto | |
| 2004/0227547 A1* | 11/2004 | Shiraishi | H01L 23/4952 327/110 |
| 2005/0274977 A1* | 12/2005 | Saito | H01L 29/404 257/280 |
| 2011/0156170 A1 | 6/2011 | Micciche | |
| 2014/0290963 A1 | 10/2014 | Segura et al. | |
| 2014/0306332 A1 | 10/2014 | Denison et al. | |
| 2016/0049786 A1* | 2/2016 | Kinzer | H02H 9/045 361/91.2 |
| 2016/0064313 A1 | 3/2016 | Denison et al. | |
| 2016/0087586 A1* | 3/2016 | Szymanowski | H01L 24/49 330/250 |
| 2016/0247751 A1 | 8/2016 | Kinzer | |
| 2017/0194237 A1 | 7/2017 | Kinzer | |
| 2018/0248521 A1* | 8/2018 | Min | H03F 3/213 |
| 2019/0140598 A1 | 5/2019 | Schultz et al. | |
| 2019/0245072 A1 | 8/2019 | Jeon et al. | |

FOREIGN PATENT DOCUMENTS

| | | |
|---|---|---|
| TW | 200830549 A | 7/2008 |
| TW | I376780 B | 11/2012 |
| TW | 201526180 A | 7/2015 |
| TW | I562324 B | 12/2016 |

OTHER PUBLICATIONS

U.S. Appl. No. 17/169,320, "Final Office Action", Jan. 6, 2023, 7 pages.
U.S. Appl. No. 17/169,320, "Non-Final Office Action", Aug. 18, 2022, 13 pages.
CN202110286323.1, "Office Action", Sep. 19, 2022, 15 pages.
TW110109631, "Notice of Decision to Grant", Dec. 5, 2022, 2 pages.
TW110109631, "Office Action", Jul. 18, 2022, 9 pages.
U.S. Appl. No. 17/169,320, "Advisory Action", Feb. 7, 2022, 7 pages.
U.S. Appl. No. 17/169,320, "Final Office Action", Nov. 26, 2021, 12 pages.
International Rectifier's iPOWIR™'s Full Function Power Stage Plus Control IC Reduces Space and Simplifies Design Of High Efficiency POL Buck Converters, iPOWIR, printed from http://www.irf.com/pressroom/pressreleases/nr071219.html, Jan. 3, 2017.
Non-Final Office Action for U.S. Appl. No. 15/050,338, mailed Dec. 2, 2016, 8 pages.
Restriction Requirementf or U.S. Appl. No. 15/050,338, mailed Sep. 28, 2016, 6 pages.
Notice of Allowance for U.S. Appl. No. 15/465,433, mailed Nov. 13, 2017, 8 pages.
Non Final Office Action for U.S. Appl. No. 17/169,304, mailed Apr. 9, 2021, 9 pages.
Notice of Allowance for U.S. Appl. No. 17/169,304, mailed Jul. 28, 2021, 7 pages.
Notice of Allowance for U.S. Appl. No. 17/169,304, mailed Sep. 9, 2021, 7 pages.
Non-Final Office Action for U.S. Appl. No. 17/169,320, mailed Jul. 15, 2021, 13 pages.
Office Action (Notice of Allowance and Fees Due (PTOL-85)) dated Apr. 15, 2025 for U.S. Appl. No. 18/339,123 (pp. 1-8).

* cited by examiner

THERMALLY ENHANCED ELECTRONIC PACKAGES FOR GaN POWER INTEGRATED CIRCUITS

CROSS-REFERENCES TO OTHER APPLICATIONS

This application is a continuation of U.S. patent application Ser. No. 17/169,304, filed Feb. 5, 2021, for "THERMALLY ENHANCED ELECTRONIC PACKAGES FOR GAN POWER INTEGRATED CIRCUITS," which claims priority to U.S. Provisional Patent Application Ser. No. 63/077,526, for "THERMALLY ENHANCED ELECTRONIC PACKAGES FOR GAN POWER INTEGRATED CIRCUITS" filed Sep. 11, 2020, which are hereby incorporated by reference in their entirety for all purposes.

This application is related to concurrently filed and commonly assigned U.S. patent application Ser. No. 17/169,320, filed Feb. 5, 2021, for "INTEGRATED HALF-BRIDGE POWER CONVERTER," which is hereby incorporated by reference in its entirety for all purposes.

FIELD

The present invention relates generally to electronic packages for semiconductor devices and in particular to electronic packages for one or more gallium nitride (GaN)-based semiconductor devices.

BACKGROUND

Electronic devices such as computers, servers and televisions, among others, typically employ one or more power conversion circuits that convert one form of electrical energy to another. In some applications the power semiconductor devices utilized in the power conversion circuits may require specialized electronic packages to accommodate their unique physical configurations and performance requirements. For example, some power semiconductor devices are now capable of operating in the tens and hundreds of Megahertz which creates a need for low inductance electronic packages with low thermal resistance for the high power density of these devices. Thus, new electronic packages that are suited for use with high frequency and high power density power semiconductor devices are needed.

SUMMARY

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

In some embodiments an electronic device comprises a leadframe including a die-attach pad, a drain terminal, a source terminal and at least one I/O terminal. The die-attach pad, the drain terminal, the source terminal and the at least one I/O terminal are electrically isolated from each other. A gallium nitride (GaN) based device attached to the die-attach pad and includes a drain coupled to the drain terminal, a source coupled to the source terminal and an I/O coupled to the at least one I/O terminal.

In some embodiments an electronic power conversion component comprises an electrically conductive package base comprising a source terminal, a drain terminal, at least one I/O terminal and a die-attach pad. The source terminal is electrically isolated from the die attach pad. A GaN-based semiconductor die is secured to the die attach pad and includes a power transistor having a source and a drain, wherein the source is electrically coupled to the source terminal and the drain is electrically coupled to the drain terminal. One or more first wirebonds electrically couple the source to the source terminal and one or more second wirebonds electrically couple the drain to the drain terminal. An encapsulant is formed over the GaN-based semiconductor die and at least a top surface of the package base.

In some embodiments an electronic device comprises an electrically conductive package base including a high side die attach pad, a low side die attach pad and a plurality of I/O terminals. A low side gallium nitride (GaN) based die is attached to the low side die attach pad, the low side GaN-based die including a low side gate, a low side drain, a low side source and a level shifter circuit. A silicon-based die includes an input for receiving a control signal and an output for transmitting a gate control signal. a high side GaN-based die is attached to the high side die attach pad, the high side GaN-based die including a high side source coupled to the low side drain, a high side gate coupled to the level shifter circuit, and a high side drain coupled to one or more of the plurality of I/O terminals. An encapsulant at least partially encapsulates the package base, the low side GaN-based die, the silicon-based die, and the high side GaN-based die.

In some embodiments an electronic power conversion component comprises an electrically conductive package base comprising a power input terminal, a ground terminal, a switch node terminal and at least one I/O terminal. A first GaN-based semiconductor device is attached to the ground terminal and includes a first power transistor having a first source contact, a first drain contact, a first gate contact and a level shift output contact. A silicon-based semiconductor device includes an input for receiving a control signal and an output for transmitting a gate control signal. A second GaN-based semiconductor device is attached to the switch node terminal and includes a second power transistor having a second source contact, a second drain contact and a second gate coupled to the level shift output contact, wherein the second source contact is electrically coupled to the first drain contact, the second drain contact is electrically coupled to the power input terminal and the first source contact is electrically coupled to the ground terminal. An encapsulant is formed over at least a portion of the electrically conductive package base, the first GaN-based semiconductor device, the silicon-based semiconductor device and the second GaN-based semiconductor device.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Figure 1:
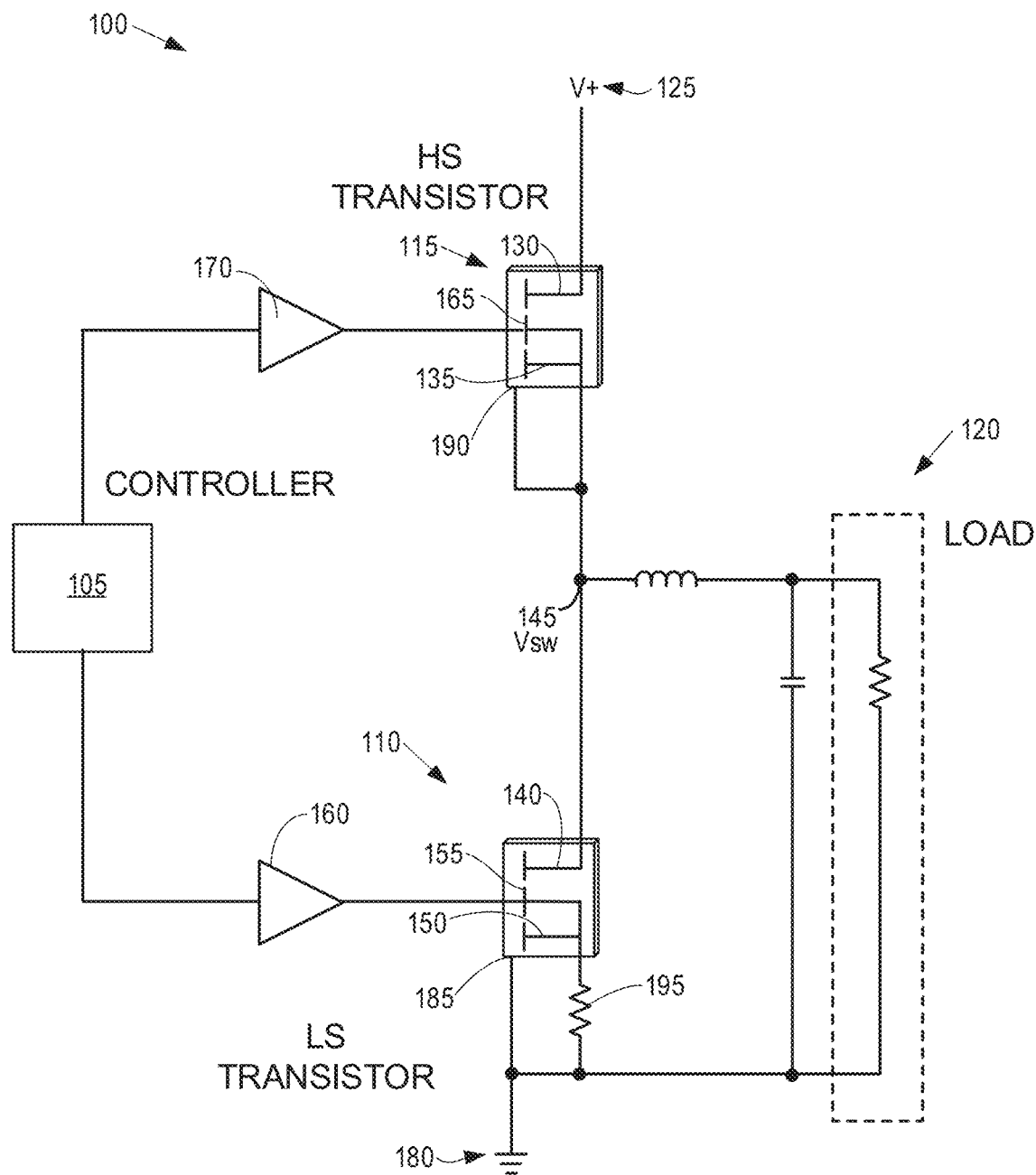
FIG. 1 is a simplified schematic of a half bridge power conversion circuit according to an embodiment of the invention.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Certain embodiments of the present invention relate to electronic packages for semiconductor devices. While the present invention can be useful for a wide variety of electronic packages, some embodiments of the invention are particularly useful for electronic packages that enable a low thermal resistance and low inductance coupling to a circuit board to which the package is attached, as described in more detail below.

For example, in some embodiments a GaN-based semiconductor device can be disposed within an electronic package having a metallic package base that is at least partially covered with a dielectric encapsulant. The GaN-based semiconductor device can be attached to a die attach pad and can include a source coupled to source terminals of the package, a drain coupled to drain terminals of the package and a gate coupled to an I/O terminal of the package. The die attach pad can be electrically isolated from source terminals enabling the die attach pad to be directly coupled to a bottom layer (e.g., ground plane) of a circuit board to which the electronic package is attached. The direct coupling to the bottom layer can enable a low thermal resistance between the GaN-based semiconductor device and the ground plane of the circuit board.

In another example an electronic package includes an internal current sensing circuit such that the source terminals of the electronic package can be electrically coupled to the die attach pad via the circuit board. The die attach pad can be directly coupled to a bottom layer (e.g., ground plane) of a circuit board to which the electronic package is attached. The direct coupling to the bottom layer enables a low thermal resistance between the GaN-based semiconductor device and the circuit board. The internal current sensing circuit replaces an external sense resistor that consumes power and heats the board. It eliminates the noise caused by that external circuit, and allows the source and ground pins to share a common ground plane for improved heat spreading and thermal management.

In order to better appreciate the features and aspects of electronic packages for GaN-based devices according to the present invention, further context for the invention is provided in the following section by discussing one particular implementation of electronic packaging for GaN-based semiconductor devices according to embodiments of the present invention. These embodiments are for example only and other embodiments may be employed for other devices such as multiple GaN-based devices in a single electronic package, a combination of GaN and silicon devices in a single electronic package or electronic packages that include one or more other types of semiconductor devices such as, but not limited to indium phosphide, gallium arsenide or silicon carbide.

Now referring to FIG. 1, an example half-bridge power conversion circuit 100 that may employ one or more packaged GaN-based semiconductor devices according to embodiments of the disclosure is illustrated. Half-bridge circuit 100 may also be known as a synchronous Buck converter. Circuit 100 is for example only and the electronic packages described herein can be used in other circuits including, but not limited to flyback converters, quasi-resonant flyback converters, active clamp flyback converters, boost converters, LLC converters, buck-boost converters, SEPIC converters, totem pole power factor correction converters, and the like without departing from this disclosure. In some embodiments circuit 100 can include low side and high side power transistors, 110, 115, respectively, (also referred to herein as switches) that are configured to regulate power delivered to a load 120, as discussed in more detail below.

More specifically, half bridge power conversion circuit 100 illustrated in FIG. 1 includes a low side GaN transistor 110 and a high side GaN transistor 115 coupled to load 120. A voltage source 125 (also known as a rail voltage) can be connected to a drain 130 of high side transistor 115, and the high side transistor can be used to control power input into power conversion circuit 100. High side transistor 115 may further have a source 135 that is coupled to a drain 140 of low side transistor 110, forming a switch node (Vsw) 145. The operation of high side transistor 115 can be controlled by a high side control gate 165 coupled to a high side transistor driver 170. High side transistor driver 170 can be controlled by controller 105.

Low side transistor 110 may have a source 150 connected to a ground 180. Low side transistor 110 may have a low side control gate 155 that is operated by a low side transistor driver 160 coupled to controller 105 and configured to be in a closed position during an off time of high side transistor 115. In some embodiments, one or more current sense resistors 195 can be coupled between source 150 and ground 180 and used to monitor current flow through circuit 100.

In some embodiments low side and high side transistors 110, 115, respectively, are GaN-based transistors that include electrically biased low side and high side substrates 185, 190, respectively. In some embodiments an appropriate electrical bias applied to low side and high side substrates 185, 190, respectively can improve the operation and reliability of low side and high side transistors 110, 115, respectively. In this embodiment low side and high side substrates 185, 190, respectively are biased to a similar voltage potential as their respective sources.

More specifically, in this embodiment, low side substrate 185 is coupled to a similar voltage potential as low side source 150, which in this embodiment is close to ground 180. Thus, low side transistor 110 includes two connections to ground 180. One connection is from source terminal 150 through one or more current sense resistors 195 and the other connection is from substrate 185 to ground 180. High side substrate 190 is coupled to switch node 145 potential so the high side substrate is at a similar potential as high side source 135. Circuit 100 can operate similar to other synchronous buck converters to regulate power delivered to load 120, as understood by one of skill in the art having the benefit of this disclosure.

Figure 2A:
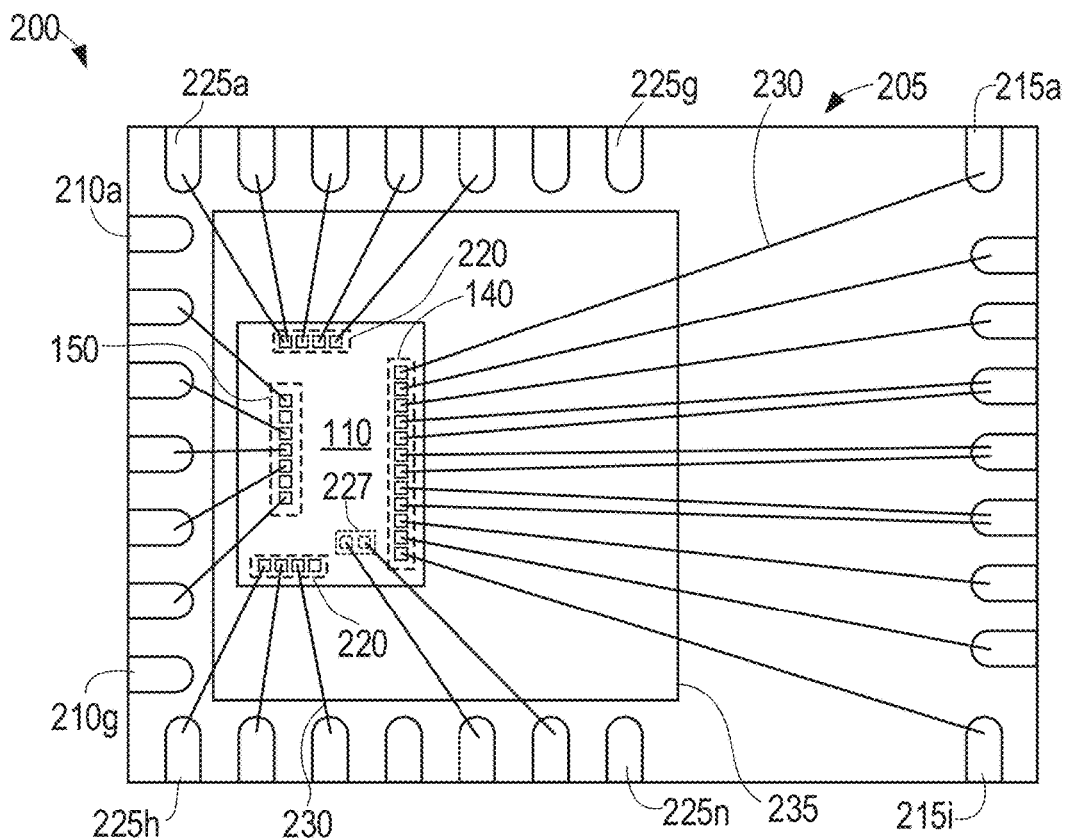
FIG. 2A is a plan view of the inside of a single switch electronic package with the encapsulant removed according to an embodiment of the invention.

FIG. 2A illustrates a plan view of an electronic package 200 (with the package encapsulant removed for clarity) that includes low side transistor 110 of circuit 100 illustrated in FIG. 1. As shown in FIG. 2A, electronic package 200 can be fabricated using a quad-flat no lead (QFN) manufacturing process where low side transistor 110 is attached to a package base 205 formed from a metal leadframe that defines a plurality of terminals, as described in more detail below. In this embodiment, source 150 of low side transistor 110 is coupled to source terminals 210a-210g of package 200, drain 140 is attached to drain terminals 215a-215i and I/O 220 are attached to I/O terminals 225a-225n using one or more wire bonds 230. In some embodiments one or more I/O 220 can be a gate for low side transistor 110, a current sense output or any other suitable signal. In further embodiments, one or more I/O terminals 225a-225n can be electrically coupled to die attach pad 235, such as for example 225f, 225g, 225m and 225n. In further embodiments low side transistor 110 can include an optional zener diode structure 227 that is coupled to one or more I/O terminals 225a-225n.

Low side transistor 110 is attached to die attach pad 235 with an electrically conductive material, thus the die attach pad is electrically and thermally coupled to substrate 185 (see FIG. 1) of the low side transistor. In this particular embodiment, source terminals 210a-210g are electrically isolated from die attach pad 235 (and from substrate 185) which enables electronic package 200 to have a low thermal resistance coupling to a circuit board to which it is attached, as described in more detail below.

Figure 2B:
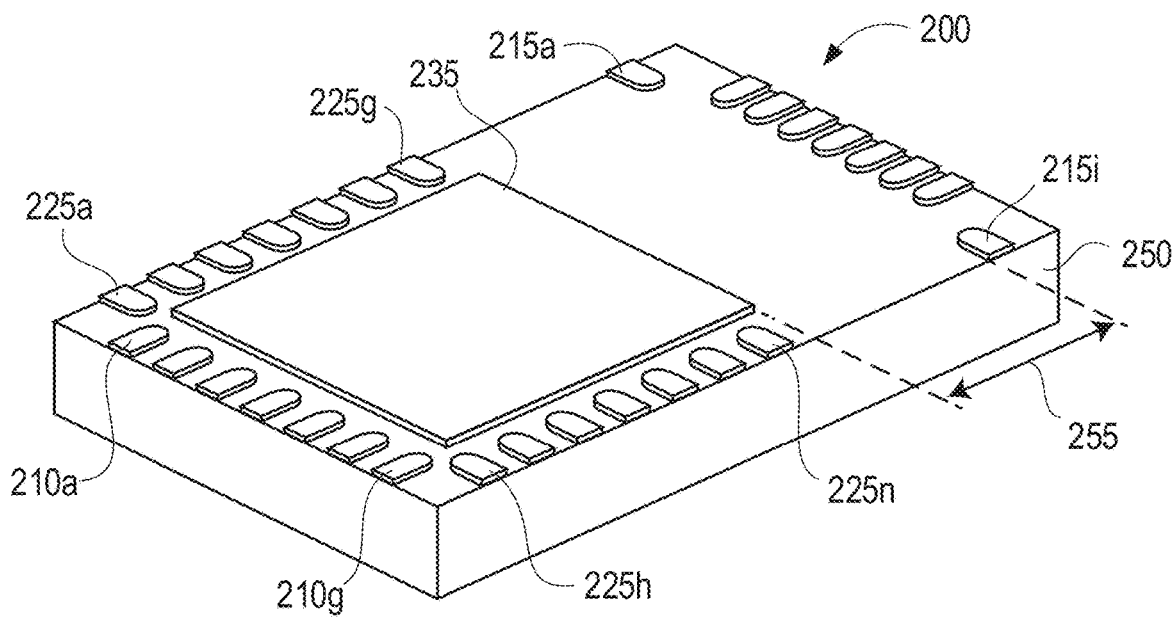
FIG. 2B is an isometric bottom view of the electronic package illustrated in FIG. 2A.

FIG. 2B illustrates a simplified isometric bottom view of package 200 shown in FIG. 2A. As shown in FIG. 2B, package 200 includes source terminals 210a-210g, die attach pad 235, drain terminals 215a-215i and I/O terminals 225a-225n, that are all electrically isolated from one another. Encapsulant 250 is formed over low side transistor 110 (see FIG. 2A), wirebonds 230 and portions of base 205. In some embodiments a creepage spacing 255 between die attach pad 235 and drain terminals 215a-215i is between 0.5 and 3.0 millimeters for creepage and clearance requirements of certain high voltage applications. To assemble package 200 to a circuit board, source terminals 210a-210g, die attach pad 235, drain terminals 215a-215i and I/O terminals 225a-225n can be soldered or otherwise coupled to corresponding metal pads on a top layer of a circuit board (not shown in FIG. 2B). In some embodiments the electrical isolation of source terminals 210a-210g from die attach pad 235 can result in the ability to efficiently couple heat from low side transistor 110, through die attach pad 235 and into the large ground plane of the circuit board to which package 200 is attached, as explained in greater detail below.

Figure 3:
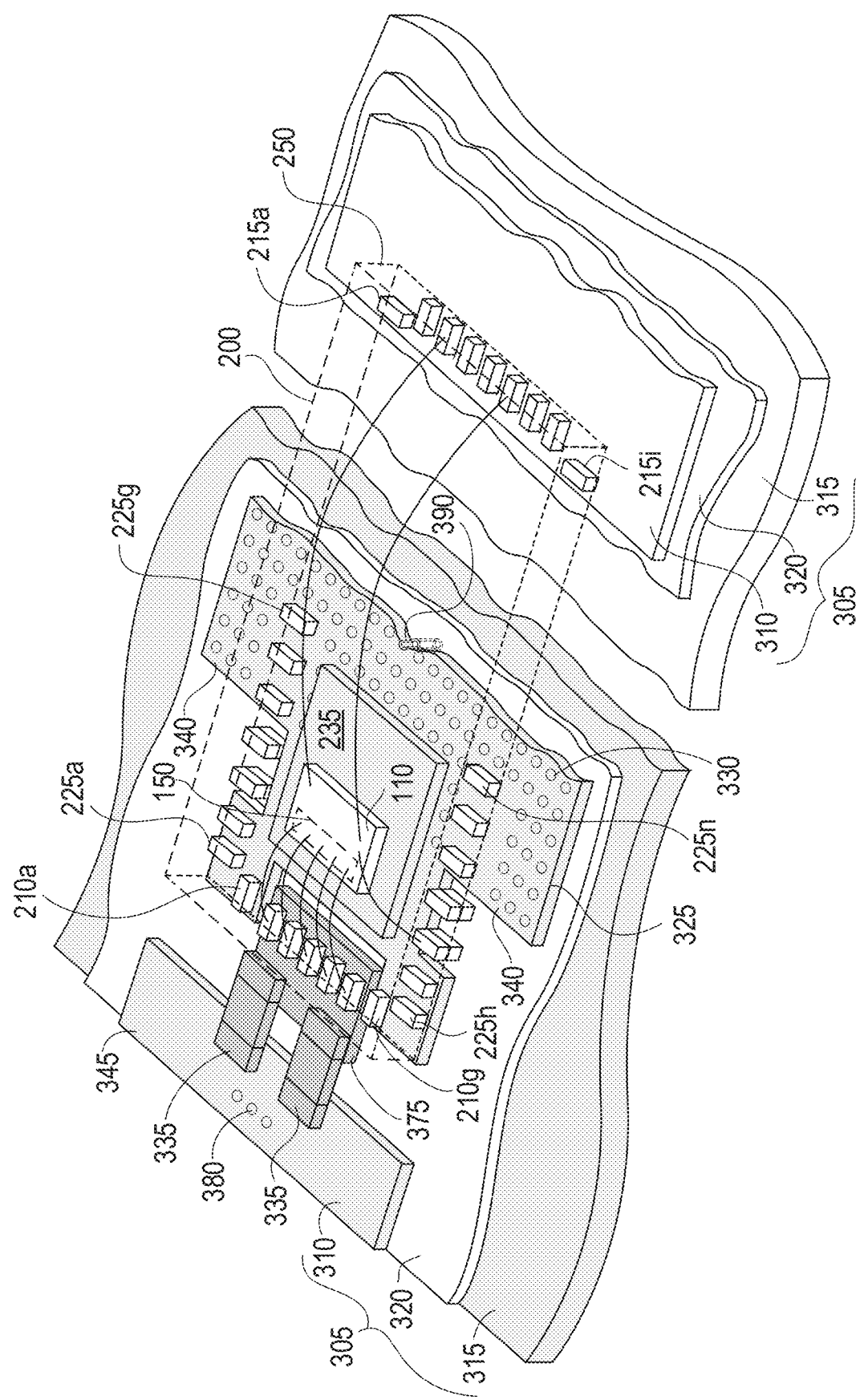
FIG. 3 is an isometric partial cross-sectional view of the electronic package illustrated in FIGS. 1-2B attached to a circuit board with accompanying external current sense resistors.

FIG. 3 illustrates a simplified partial cross-sectional view of package 200 attached to a circuit board 305. As shown in FIG. 3, encapsulant 250 of package 200 is shown as a transparent material so die attach pad 235, source terminals 210a-210g, drain terminals 215a-215i and I/O terminals 225a-225n can be shown in greater detail. In this embodiment, package 200 is attached to a top layer 310 of circuit board 305. Circuit board 305 also includes a bottom layer 315 that may be what is commonly called a ground plane, however in other embodiments the circuit board can have more than two layers, many of which can be used as ground planes. In this embodiment top layer 310 is electrically insulated from bottom layer 315 by one or more electrically insulative layers 320. Electrically insulative layers 320 can be composed of an organic laminate commonly referred to as FR4, FRS, BT or any other suitable structure.

As appreciated by one of skill in the art the one or more ground planes of a circuit board (e.g. bottom layer 315) can be used as an efficient heat sink that receives thermal energy from package 200 and efficiently dissipates the thermal energy within the circuit board. Ground planes typically have a high percentage of metal, often including copper, that can efficiently reduce thermal energy density, as compared to signal layers that typically have a low percentage of metal. Conversely, the one or more electrically insulative layers 320 can be made from organic or other insulative materials and can have a thermal conductivity that is, for example, one to three orders of magnitude less than copper which can be used to top and bottom layers 310, 315, respectively. In some embodiments package 200 can be arranged to efficiently transfer thermal energy from low side transistor 110 to bottom layer 315 (e.g., a ground plane) by using thermal vias that are copper filled or copper plated to provide a low thermal impedance between low side transistor 110 and the bottom layer, as described in greater detail below.

In the embodiment shown in FIG. 3, low side transistor 110 is electrically and thermally coupled to die attach pad 235 using solder, conductive epoxy or other die attach material having a relatively low thermal impedance. Thus, not only is die attach pad 235 the electrical connection to substrate 185 (see FIG. 1) of low side transistor 110, it is also an efficient thermal path to conduct heat out of the low side transistor. In this embodiment, die attach pad 235 is electrically isolated from source terminals 210a-210g such that the die attach pad can be directly coupled to bottom layer 315 (e.g., a ground plane) of circuit board 305 enabling a low thermal resistance between low side transistor 110 and circuit board 305. More specifically, in one example embodiment, die attach pad 235 can be soldered to a die attach pad portion 325 of top layer 310 which can be thermally and electrically coupled to bottom layer 315 by a plurality of vias 330. Each via 330 can include a metal barrel 390 that provides an efficient thermal conduit between top layer 310 and bottom layer 315, providing package 200 with a low thermal resistance between low side transistor 110 and bottom layer 315. In further embodiments one or more ground planes can be on the top layer, the bottom layer and on one or more intermediate layers.

In this embodiment, source terminals 210a-210g are coupled to bottom layer 315 (e.g., a ground plane) through a separate electrical path that forces all source current through current sense resistors 335. By electrically isolating source terminals 210a-210g from die attach pad 235 (even though both are ultimately coupled to ground 180) current sensing can be performed by current sense resistors 335 and the die attach pad can be directly coupled to bottom layer 315 (e.g. ground plane) enabling package 200 to have a low thermal impedance from low side transistor 110 to circuit board 305.

In this particular embodiment, die attach pad portion 325 of top layer 310 extends beyond two lengthwise edges of package 200 with extensions 340 to increase thermal spreading in the top layer and to provide additional area to increase the number of vias 330 connecting the top layer (and die attach pad 235) to bottom layer 315. Source terminals 210a-210g are attached to a source terminal portion 375 of top layer 310 that is coupled to current sense resistors 335. Current sense resistors are then coupled to current sense pad 345 that is coupled to bottom layer 315 (e.g., ground plane) through one or more ground vias 380.

In some embodiments, due to the relatively high transient current and voltage signals at source 150, source terminal portion 375 and current sense resistors, these regions can be electrically noisy (e.g., sources of electromagnetic interference (EMI)) which can interfere with other adjacent circuits. Because die attach pad 235 and die attach pad portion 325 of top layer 310 are directly coupled to bottom layer 315 (e.g., ground plane) these features can be used as electromagnetic shields for low side transistor 110 and other circuitry within package 200. More specifically, as shown in FIG. 3 there are two different colors of shaded regions to illustrate the separation of the relatively noisy source terminal portion 375 and current sense resistors 335 (shown in a darker shade) from the relatively stable (e.g., less noisy) regions that can be used as EMI shielding such as bottom layer 315, die attach pad portion 325 and die attach pad 235 (shown in a lighter shade).

Thus, in some embodiments the electrical isolation between die attach pad 235 and source terminals 210a-210g enables package 200 to have a low thermal impedance to bottom layer 315 of circuit board 305 as well as providing EMI protection for circuits within the package. In other embodiments that may not use current sense resistors 335, electrical isolation between die attach pad 235 and source terminals 210a-210g enables the source terminals and die attach pad 235 of package 200 to be electrically coupled together on top layer 310 of circuit board 305, such that die attach pad portion 325 of top layer 310 can be increased in size permitting thermal energy to be dissipated on three sides of package 200, as shown and described later in FIG. 5.

As further illustrated in FIG. 3, in some embodiments one or more I/O terminals 225a-225n can be electrically and/or thermally coupled to die attach pad 235 to increase the effective area of the die attach pad to further reduce thermal impedance to bottom layer 315. In one embodiment I/O terminals 225a, 225b, 225e-225i and 225l-n can be electrically and thermally shorted to die attach pad 235 leaving I/O terminals 225c, 225d, 225j and 225k as individual signal pins (e.g., gate drive signal, control signal, etc.) coupled to one or more semiconductor devices within electronic package 200.

Although the terms low side transistor and high side transistor are used herein, it is understood that in any embodiments described within this disclosure that the low side transistor and the high side transistor may include other circuitry such as, but not limited to low and high side drivers, portions of drivers, current sense circuits and any other ancillary circuits. In one embodiment low side transistor and/or high side transistor can each include a power field-effect transistor (FET) and a pull-down transistor that is coupled to the power FET.

Although package 200 has been described herein as including low side transistor 110, one of skill in the art having the benefit of this disclosure will appreciate that a similar package could be used for high side transistor 115 (see FIG. 1), a combination of high side transistor and low side transistors 110, or any other combination of devices. Additional package configurations are described herein, however this disclosure is in no way limited to these configurations nor is it limited to the use of such a package configuration in any specific type of electrical circuit.

Figure 4:
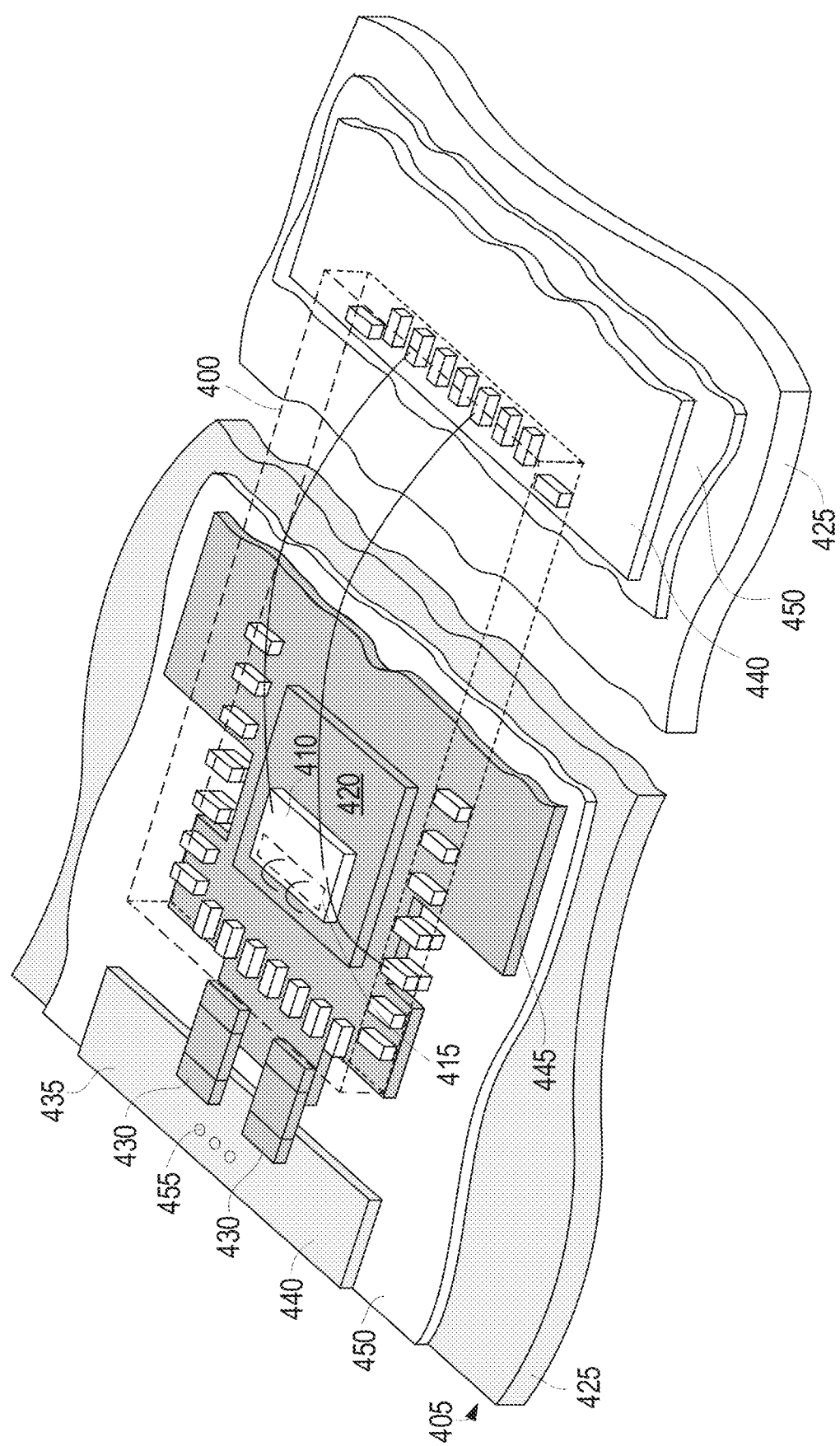
FIG. 4 is an isometric partial cross-sectional view of an electronic device.

FIG. 4 illustrates a simplified partial cross-sectional view of an electronic package device 400 attached to a circuit board 405. As shown in FIG. 4, device 400 also employs a QFN structure, however device 400 has a transistor 410 including a source 415 of that is electrically coupled to die attach pad 420, instead of to electrically isolated source terminals 210*a*-210*g* as was the arrangement of package 200. Thus, die attach pad 420 of device 400 follows the voltage potential of source 415 and is isolated from a bottom layer 425 (e.g., ground plane) of circuit board 405 until "after" current sense resistors 430 at resistor pad 435. This isolation enables all current that flows through source 415 to flow through current sense resistors 430 providing an accurate indication of current flowing to the load. After the current flows through current sense resistors 430, the current is coupled to resistor pad 435 which is coupled to bottom layer 425 (e.g., ground plane) using one or more ground vias 455. The electrical isolation of die attach pad 420 from bottom layer 425 (e.g., ground plane) generally results in a higher thermal impedance between transistor 410 and bottom layer 425 of circuit board 405 as compared to the embodiment shown in in FIG. 3.

The higher thermal resistance is primarily due to the lack of vias 330 (see FIG. 3) that thermally and electrically couple top layer 440 to bottom layer 425. More specifically, circuit board 405 does not have vias 330 (see FIG. 3) that couple die attach pad portion 445 of top layer 440 to bottom layer 425 (e.g., ground plane). Thus, to dissipate thermal energy generated by low side transistor 410, device 400 transfers thermal energy to top layer 440 which then couples thermal energy to bottom layer 425 through electrically insulative layer 450 of circuit board 405. Electrically insulative layer 450 can be between one to three orders of magnitude lower thermal conductivity than vias 330 (see FIG. 3), resulting in an increase in thermal impedance as compared to the architecture shown in FIG. 3.

Further, because die attach pad 420 is directly coupled to source 415 and to current sense resistors 430, the die attach pad and die attach pad portion 445 of top layer 440 are electrically "noisy" and may not function as EMI shields as they did in FIG. 3. Rather, in the configuration shown in FIG. 4, noise emanating from die attach pad portion 445 of top layer 440 and die attach pad 420 can negatively affect transistor 410 and or other adjacent circuits that are proximate to or within device 400. More specifically, as shown in FIG. 4 there are two different colors of shaded regions to illustrate the separation of the relatively noisy die attach pad 420, die attach pad portion 445 and current sense resistors 430 (shown in a darker shade) from the relatively stable (e.g., less noisy) regions that can be used as EMI shielding such as bottom layer 425 (shown in a lighter shade).

Figure 5:
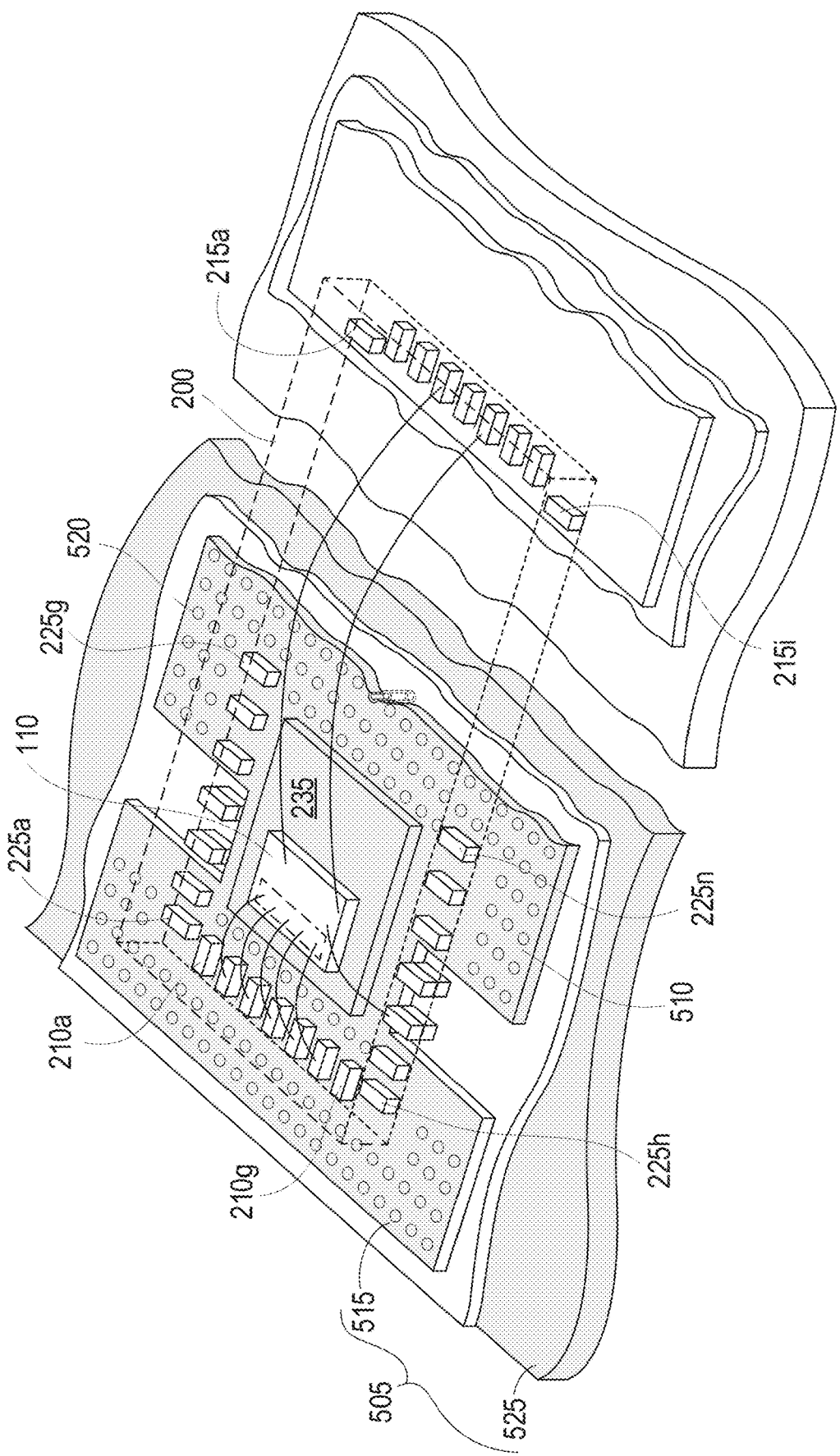
FIG. 5 is an isometric partial cross-sectional view of the electronic package illustrated in FIGS. 1-3 attached to a circuit board.

FIG. 5 illustrates a simplified partial cross-sectional view of electronic package 200 of FIG. 2 attached to a different circuit board 505. As shown in FIG. 5, in contrast with circuit board 305 of FIG. 3, circuit board 505 of FIG. 5 does not include current sense resistors 335 because current sensing is performed within transistor 110 and/or within electronic package 200, as described in more detail below. Further, in this embodiment a main pad portion 510 of top layer 515 electrically couples die attach pad 235 to source terminals 210*a*-210*g*. This enables main pad portion 510 to extend into the area that was used by current sense resistors 335 (see FIG. 3) such that thermal energy can be distributed on three sides of package 200 as compared to on two sides of package 200 as illustrated in FIG. 3. This also enables a greater number of vias 520 that couple top layer 515 to bottom layer 525, reducing thermal impedance from the top layer to the bottom layer. Thus, as shown in FIGS. 3 and 5 one package 200 can be used with different configurations of circuit boards 405, 505 and provide a low thermal impedance coupling to bottom layer 525.

Figure 6A:
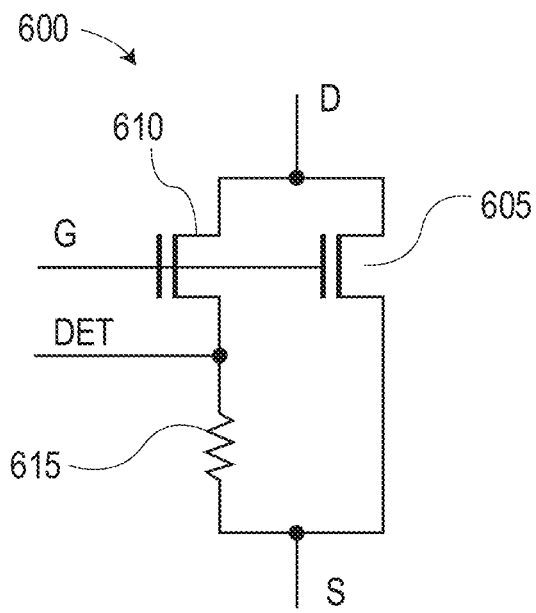
FIG. 6A illustrates a simplified schematic of a current sensing circuit according to an embodiment of the invention.

FIG. 6A illustrates a simplified electrical schematic of a current sensing circuit 600, according to embodiments of the disclosure. As shown in FIG. 6, current sensing circuit 600 includes a main transistor 605 coupled in parallel with a detection transistor 610 and a detection resistor 615. More specifically gates, sources and drains of main transistor 605 and detection transistor 610 are all coupled together, respectively, such that the main transistor and the detection transistor are coupled between the same circuit nodes and operate simultaneously. In some embodiments detection transistor 610 is formed in a substantially identical way as main transistor 605, except the detection transistor has a fewer number of parallel transistor structures causing it to have a higher on-resistance than main transistor. Thus, when a particular gate voltage is simultaneously applied to both main transistor 605 and detection transistor 610, a proportionally reduced amount of current flows through the detection transistor. The amount of current flowing through detection transistor 610 can be determined by measuring the voltage potential across detection resistor 615.

Because there is a proportional amount of current flowing through detection transistor 610, a signal that is generated by the detection transistor and/or detection resistor 615 can be considered a ratioed output signal. More specifically the ratioed output signal represents a ratio of the current flowing through detection transistor 610 as compared to the current flowing through main transistor 605. In one embodiment the ratioed output signal can be provided at an I/O terminal of an electronic package (e.g., electronic package 200 illustrated in FIGS. 2-3 and 4) and can supply a current that is a fixed ratio of a current flowing through main transistor 605. Because the current flowing through detection transistor 610 is proportionally less than the current flowing through main transistor 605, the power dissipation of detection resistor 615 may be proportionally smaller than a resistor that is coupled in parallel with main transistor 605.

In some embodiments detection transistor 610 and main transistor 605 are formed monolithically on a unitary semiconductor device, while in other embodiments they can be formed on different semiconductor devices. In various embodiments a co-packaged silicon-based device can detect current flowing through main transistor 605 and generate an output current signal that is a ratioed output signal. In other embodiments main transistor 605 can be a GaN-based semiconductor device and detection transistor 610 can be a silicon-based device that allows current to flow in proportion to the main transistor. These and any other types of integrated current sensing devices can be incorporated within package 200 which can be used with circuit board 505 illustrated in FIG. 5. The aforementioned current sensing circuits and other such embodiments are disclosed in co-owned U.S. Pat. No. 10,666,147, which is incorporated by reference herein in its entirety for all purposes.

Figure 6B:
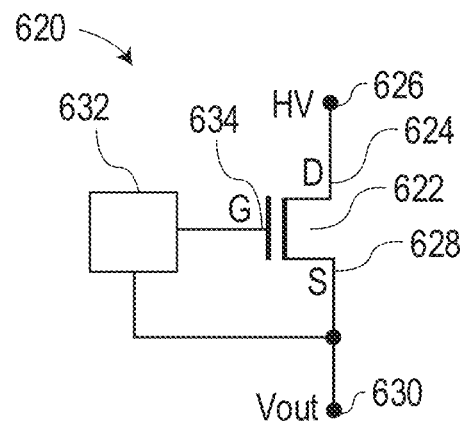
FIG. 6B illustrates a simplified schematic of a high-voltage startup circuit, according to embodiments of the disclosure.

FIG. 6B illustrates a simplified schematic of a high-voltage startup circuit 620, according to embodiments of the disclosure. As shown in FIG. 6B a high-voltage depletion mode GaN-based transistor 622 includes a drain 624 coupled to a high-voltage potential 626 such as a high-voltage rail. Source 628 is coupled to an output terminal 630 that can supply a startup voltage to a circuit, such as a half-bridge circuit. To control a voltage at output terminal 630, a control circuit 632 senses a voltage at output terminal 630 and controls a gate terminal 634 of high voltage depletion mode GaN-based transistor 622. In some embodiments high-voltage depletion mode GaN-based transistor 622 is a separate discrete device while in various embodiments it can be integrally formed on a low-side GaN-based die such as low-side substrate 185, illustrated in FIG. 1.

Figure 6C:
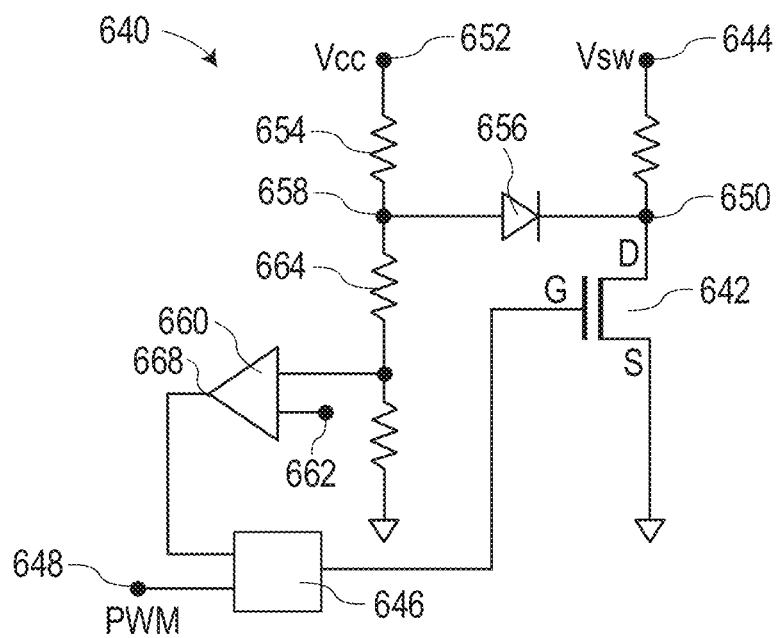
FIG. 6C illustrates a simplified schematic of a desaturation detection circuit, according to embodiments of the disclosure.

FIG. 6C illustrates a simplified schematic of a desaturation detection circuit 640, according to embodiments of the disclosure. As shown in FIG. 6C desaturation detection circuit 640 can detect when a power transistor 642 (e.g., high side transistor 115 (see FIG. 1) or low side transistor 110) goes into desaturation which can cause damage to the transistor. In this particular embodiment power transistor 642 is a low side transistor having a source coupled to ground and a drain coupled to a switch node 644. Gate is controlled by gate control logic circuit 646. When PWM node 648 is high, gate logic transmits a high gate signal to gate of power transistor 642 turning it on such that detection node 650 is relatively close to ground potential. Vcc 652 feeds current through resistor 654, through diode 656, through power transistor 642 to ground. When power transistor 642 enters a desaturation mode a resistance of the power transistor increases and a voltage at detection node 650 increases proportionally.

As voltage at detection node 650 continues to increase, a voltage at divider node 658 changes proportionally. A comparator 660 can be configured to detect when voltage at divider node 658 changes by a predetermined amount through appropriate control of voltage supplied at a Vref node 662 and selection of the values of resistors 654 and 664. After voltage at detection node 650 passes a predetermined threshold voltage, comparator 660 transmits a fault signal through output 668 to gate control logic circuit 646. If gate control logic circuit 646 determines that PWM node 648 is high and simultaneously receives a fault signal from comparator 660, the gate control logic circuit transmits a low signal to gate to turn off power transistor 642. In some embodiments diode 656 is a GaN-based diode connected transistor (e.g., gate tied to drain) and is formed monolithically with power transistor 642. As described above, in some embodiments diode 642 can be formed on a high side GaN based device and electrically coupled to a source of a high side power transistor to protect high side power transistor from desaturation and/or a fault condition.

Figure 7A:
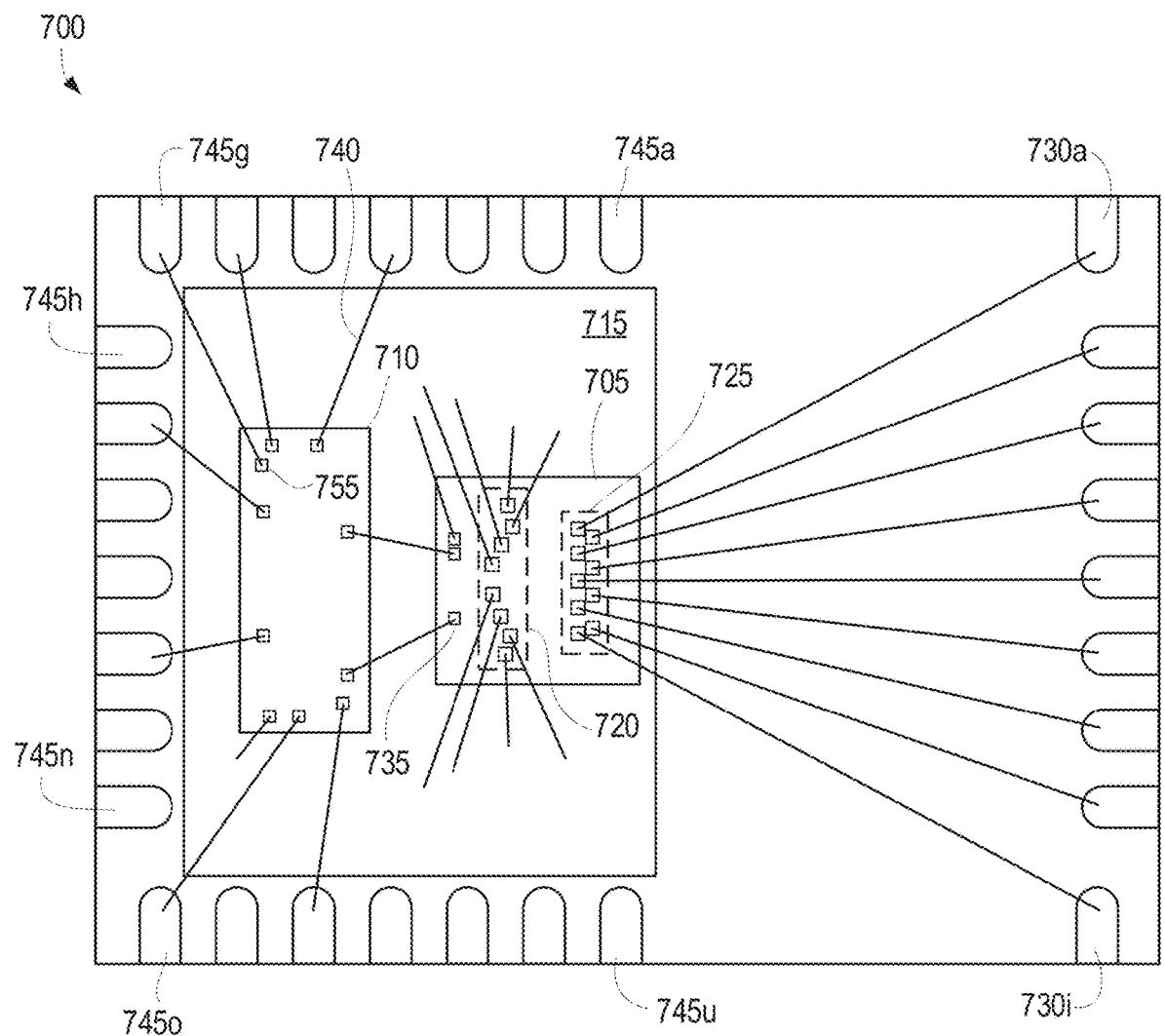
FIG. 7A is a transparent plan view of an electronic package with the encapsulant removed, the package including a co-packaged silicon and GaN-based single switch, according to an embodiment of the invention.

FIG. 7A illustrates a transparent plan view of an electronic package 700 that may be similar to electronic package 200 illustrated in FIGS. 3 and 5. As shown in FIG. 7, electronic package 700 can be fabricated using a quad-flat no lead (QFN) manufacturing process where a GaN-based power transistor 705 and a silicon-based driver/control device 710 are attached to a die attach pad 715. In this particular embodiment, GaN-based power transistor 705 can include any or all of a GaN-based power transistor, a current sense circuit and/or one or more portions of a driver circuit for the power transistor.

In some embodiments, GaN-based power transistor 705 includes a source 720 coupled to die attach pad 715, a drain 725 coupled to one or more drain terminals 730a-730i and a gate 735 connected to silicon-based driver/control device 710 via wirebonds 740. In this embodiment, because there is an internal current sense circuit, source 720 of GaN-based power transistor 705 can be electrically coupled to die attach pad 715 without negatively affecting a thermal resistance between package 700 and a circuit board to which it is attached. Silicon-based driver/control device 710 can include one or more I/O connections 755a that are coupled to I/O terminals 745a-745u formed via wirebonds 740.

In some embodiments one of the one or more I/O connections 755 is a current sense output that generates a ratioed current sense output signal that corresponds to a current flowing through GaN-based power transistor 705. In some embodiments the current sense circuit can be similar to current sense circuit 600 described in FIG. 6, however in other embodiments a different type of current sense circuit can be used. In one embodiment at least a portion of the current sense circuit can be integrated in silicon-based driver/control device 710 such that the silicon-based device transmits a ratioed current sense signal at an I/O terminal 745a-745u of package 700.

As described above with regard to FIG. 5, electronic package 700 includes an internal current sense feature so source 720 of GaN-based power transistor 705 can be electrically coupled to die attach pad 715 and the die attach pad can be directly coupled to a ground plane of a corresponding circuit board to provide a low thermal impedance between GaN-based power transistor 705 and the circuit board.

In further embodiments GaN-based power transistor 705 includes a power transistor device coupled to a pull-down device that are both monolithically formed on one die. In some embodiments driver/control device 710 includes a pull-down driver circuit that transmits a signal to the pull-down device to turn off the power transistor. In further embodiments, driver/control device 710 receives an indication of a drain voltage of GaN-based power transistor 705, and uses that signal to detect if an overcurrent or short circuit condition occurs while the power transistor in an on state. Driver/control device 710 can also include an enable function to keep GaN-based power transistor 705 in a sleep mode, and in some embodiments also has an auto-enable function to command the driver/control device 710 to a standby state after a predetermined interval without receiving a PWM input signal, which can reduce current consumption. In yet further embodiments driver/control device 710 can include one or more power rail circuits that deliver a predetermined voltage and/or current to the digital isolator or any other external circuitry.

Figure 7B:
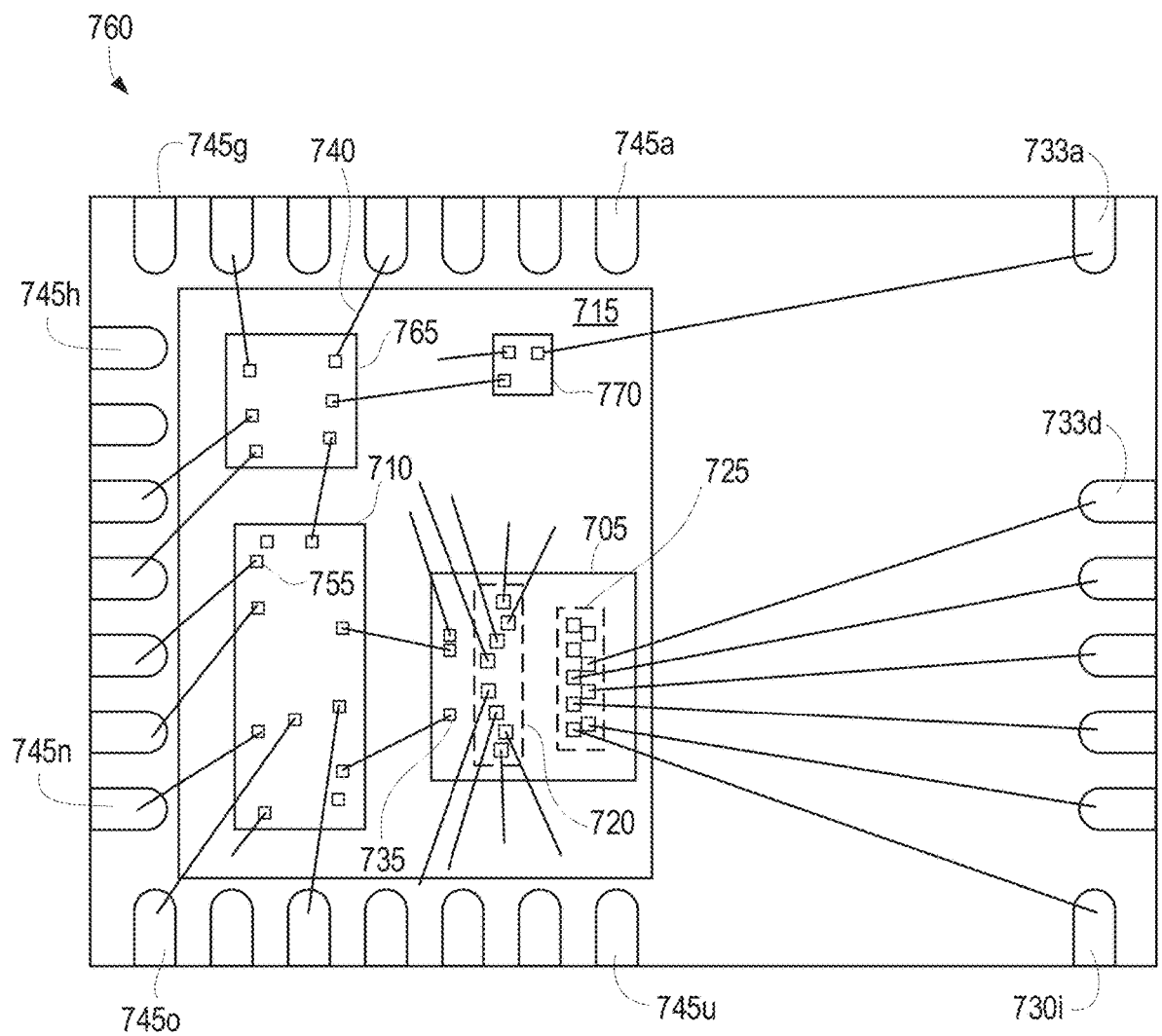
FIG. 7B is a transparent plan view of an electronic package with the encapsulant removed, the package including an integrated controller with separate high voltage device for startup, according to an embodiment of the invention.

FIG. 7B illustrates a transparent plan view of an electronic package 760 that may be similar to electronic package 700 illustrated in FIG. 7A, however in this embodiment the electronic package also includes a controller 765 and a startup transistor 770 attached to die attach pad 715. In some embodiments controller 765 can be a silicon or GaN-based device and in one embodiment can be a quasi-resonant flyback controller that delivers one or more PWM signals that control operation of GaN-based power transistor 705. In further embodiments controller 765 can also transmit one or more control signals (e.g., a high-side PWM drive signal) that controls operation of a separate high-side power transistor.

In some embodiments startup transistor 770 can be what is commonly known as a JFET device that is coupled to a rectified high voltage AC line at I/O terminal 733a. In some embodiments, to provide a voltage withstanding distance, one or more of terminals 730a-730g can be removed (e.g., FIG. 7B shows that drain terminals 730b and 730c have been removed). Startup transistor 770 can allow current from the rectified high voltage AC line to power controller 765 during startup until power can be supplied to the controller from another source, such as, for example, from an auxiliary winding of a transformer. Controller/driver 765 and GaN-based power transistor 705 can have any of the features described above.

Figure 7C:
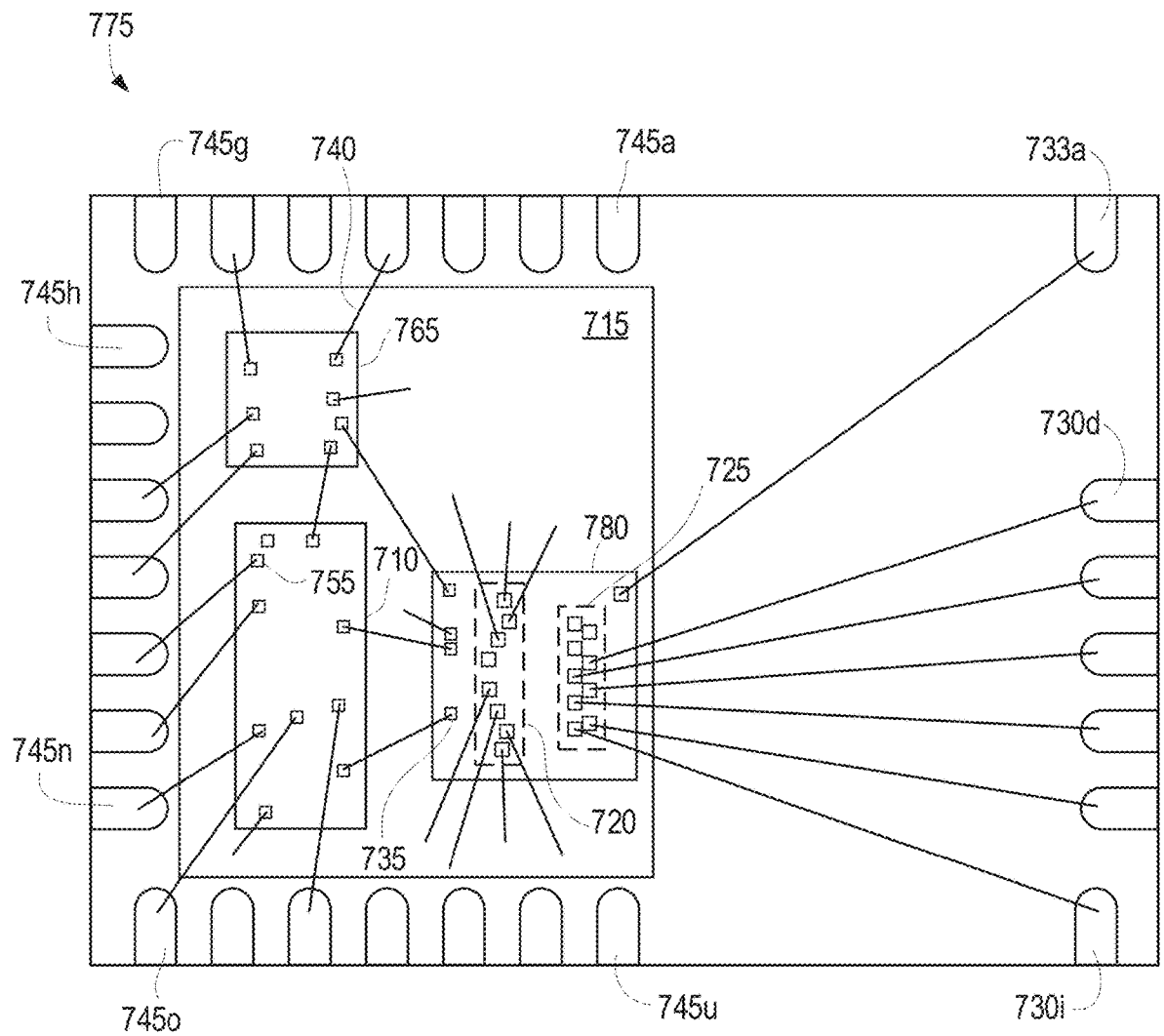
FIG. 7C is a transparent plan view of an electronic package with the encapsulant removed, the package including an integrated controller with a GaN-based high voltage startup circuit, according to an embodiment of the invention.

FIG. 7C illustrates a transparent plan view of an electronic package 775 that may be similar to electronic packages 700 and 750 illustrated in FIGS. 7A and 7B, respectively, however in this embodiment GaN-based power transistor 780 includes an integrated startup transistor that performs a similar function as startup transistor 770 illustrated in FIG. 7B. More specifically, in this embodiment GaN-based power transistor 780 may include a power transistor device, a pull-down device and a startup transistor device monolithically integrated on a single die. In some embodiments the startup transistor can be a depletion-mode GaN FET that can have a negative pinch-off voltage. In one embodiment the pinch-off voltage can be between −10 to −25 volts.

During startup, the gate at ground can cause an appropriate voltage to be delivered to controller 765 from the source. Once powered up to start controller 765, the depletion-mode transistor could be switched off with a switch coupled in series connection between VDD and a source contact of the depletion-mode transistor. In some embodiment the GaN-based startup transistor can enable the startup circuit to be as capable of handling voltage spikes as the power transistor, as compared to the embodiment illustrated in FIG. 7B that may limit the operation voltage to a lower voltage due to the lower maximum operating voltage of startup transistor 770. In one embodiment the GaN-based startup transistor can handle up to 800 volts whereas in some embodiments a JFET startup transistor may be limited to 600 volts.

Figure 7D:
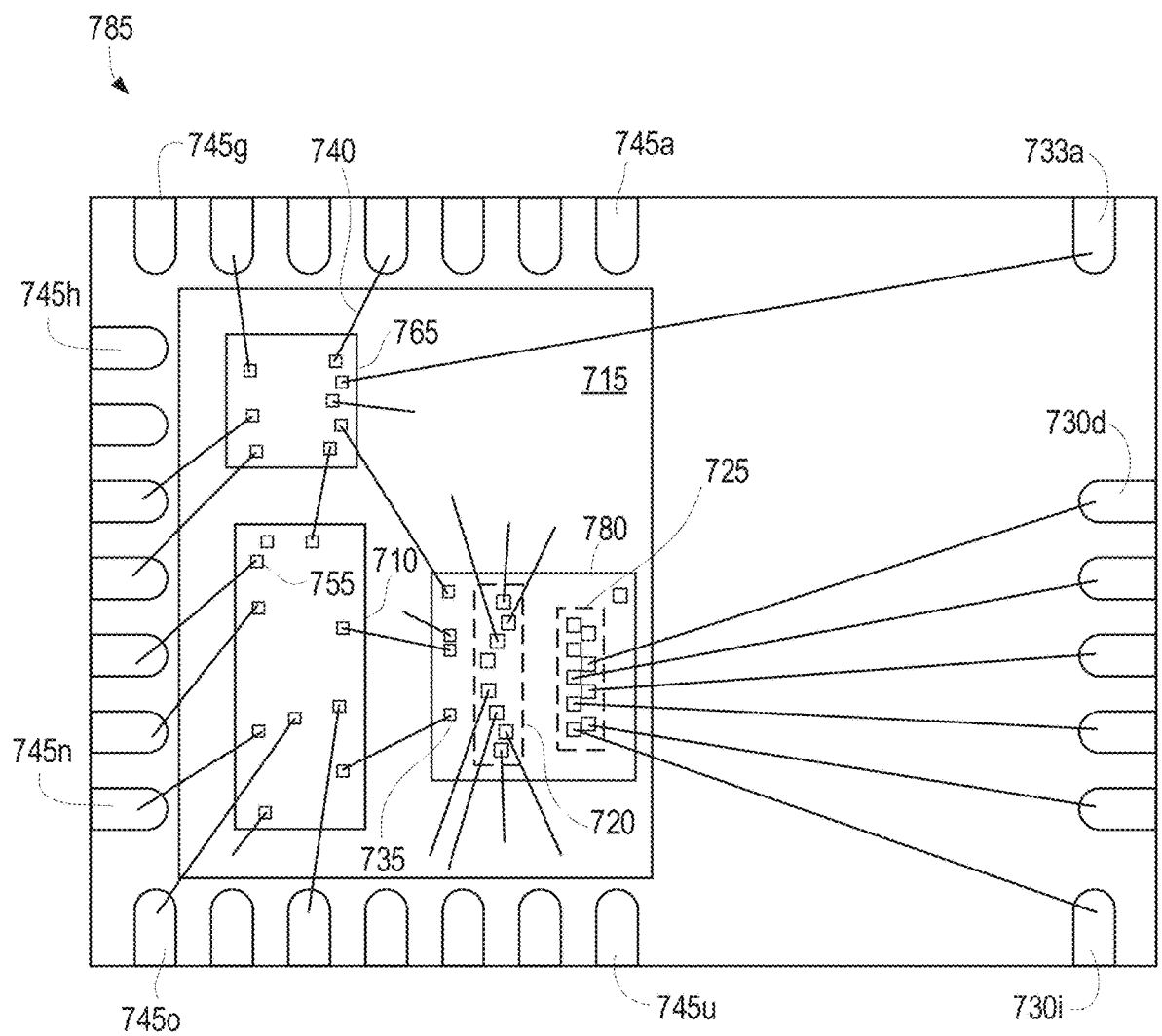
FIG. 7D is a transparent plan view of an electronic package with the encapsulant removed, the package including an integrated controller with a silicon-based high voltage startup circuit, according to an embodiment of the invention.

FIG. 7D illustrates a transparent plan view of an electronic package 785 that may be similar to electronic packages 700, 760 and 775 illustrated in FIGS. 7A, 7B and 7C, respectively, however as compared to package 760 of FIG. 7B, in this embodiment controller 765 includes an integrated startup transistor that performs a similar function as startup transistor 770 illustrated in FIG. 7B. More specifically, in this embodiment controller 765 may include a startup transistor that is coupled to I/O terminal 733*a* configured to receive a rectified high voltage signal. The rectified high voltage signal can be used to supply startup voltage and current to controller 765 until the circuit achieves normal operation and power for the controller can be supplied by another source, such as an auxiliary winding of a transformer.

Figure 7E:
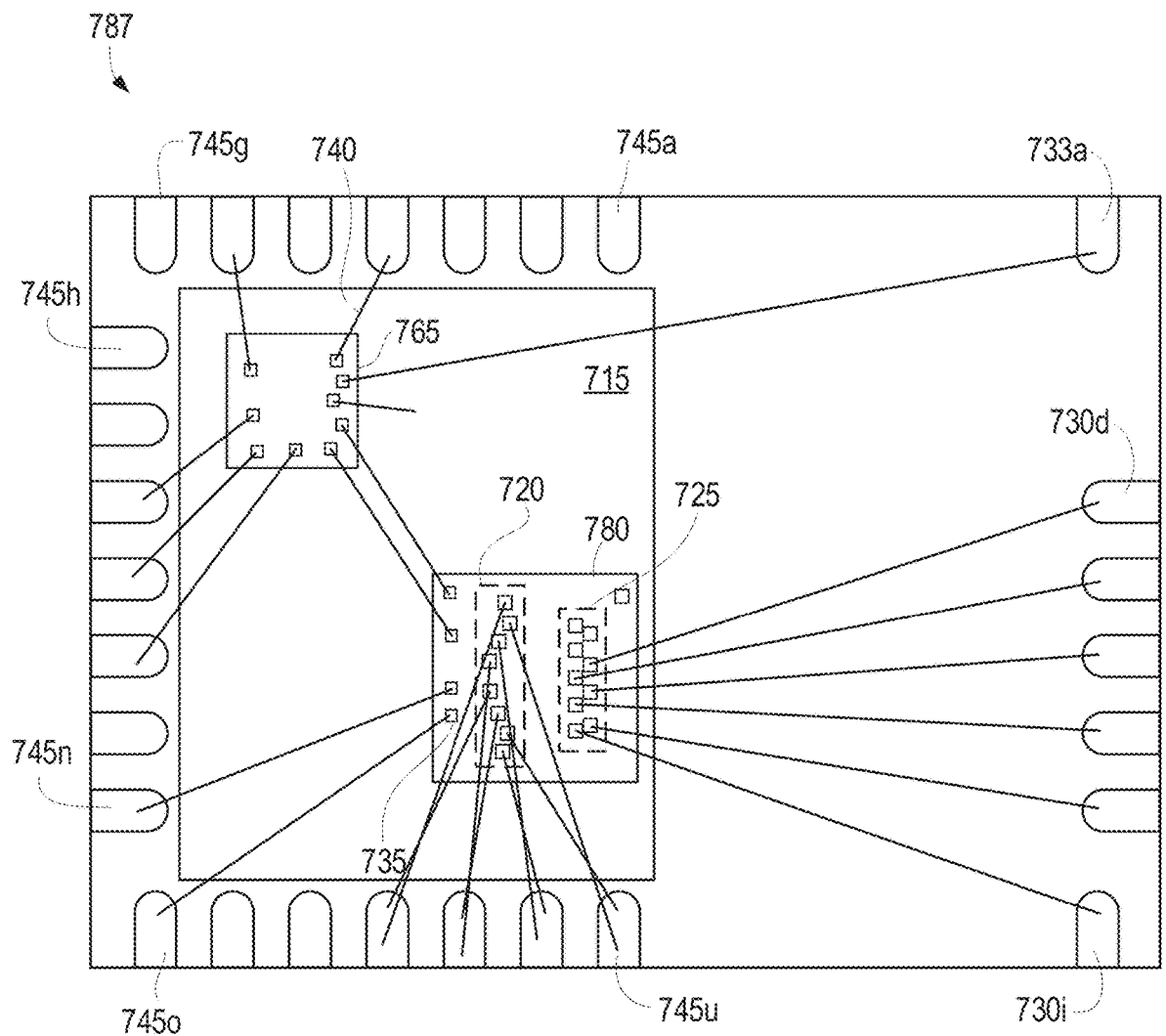
FIG. 7E is a transparent plan view of an electronic package with the encapsulant removed, the package including a GaN-based power device and a silicon-based controller that includes some or all of the functionality of a GaN-based driver/control device, according to an embodiment of the invention.

FIG. 7E illustrates a transparent plan view of an electronic package 787 that may be similar to electronic packages 700, 760, 775 and 785 illustrated in FIGS. 7A, 7B, 7C and 7D, respectively, however as compared to package 785 of FIG. 7D, in this embodiment there is no driver/control device 710, and source 720 is coupled to external I/O terminals 745*r*-745*u*, not to die attach pad 715 as shown in previous embodiments. That is, in some embodiments GaN-based power transistor 780 may not be equipped with a current sense circuit, thus I/O terminals 745*r*-745*u* can be coupled to external current sense resistors that indicate current flowing through the GaN-based power transistor. Controller 765 may have one or more interconnects with GaN-based power transistor 780 including at least a drive signal to control operation of the GaN-based power transistor.

Figure 7F:
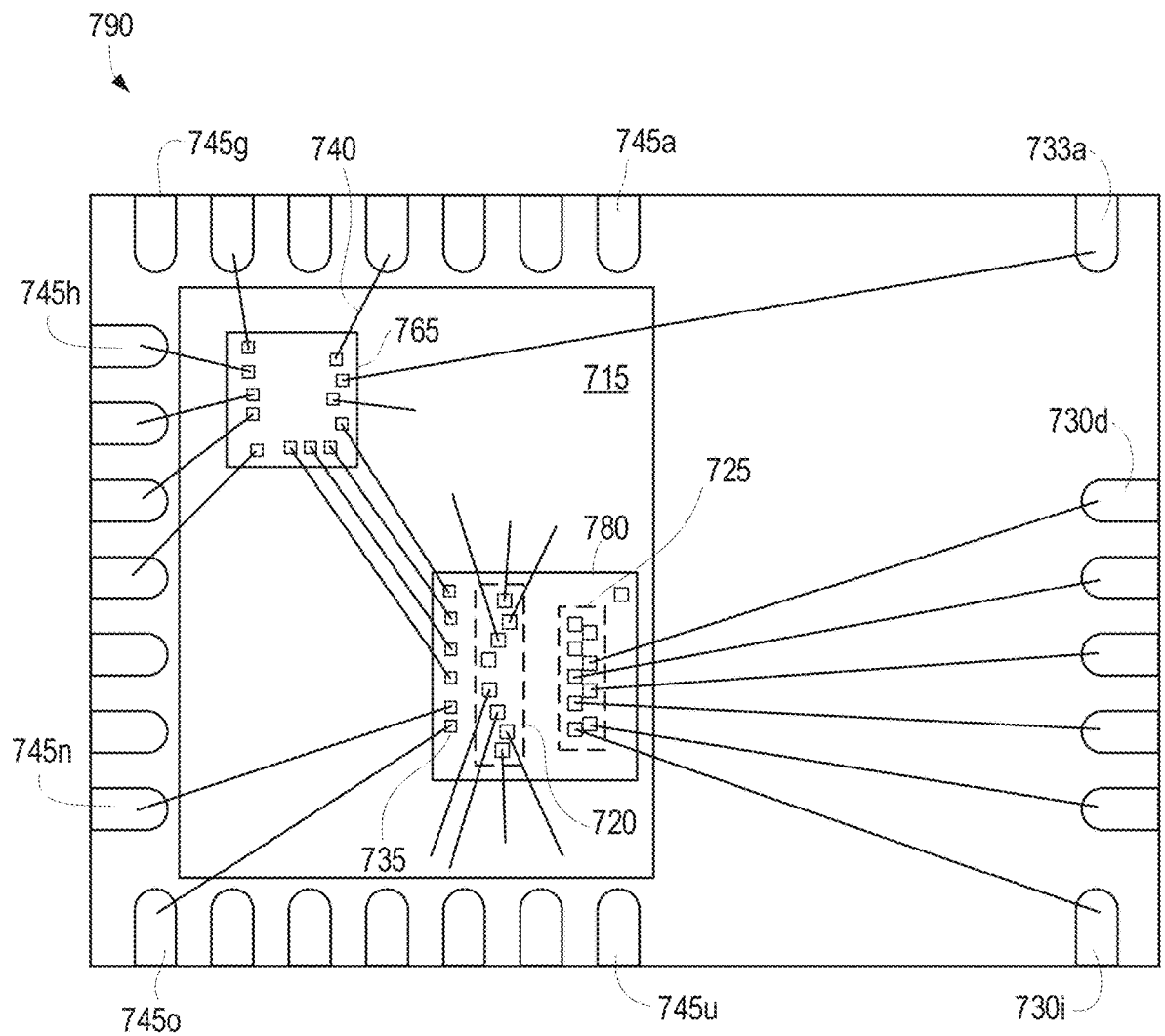
FIG. 7F is a transparent plan view of an electronic package with the encapsulant removed, the package including a GaN-based power device with a current sense circuit and a silicon-based controller that includes some or all of the functionality of a GaN-based driver/control device according to an embodiment of the invention.

FIG. 7F illustrates a transparent plan view of an electronic package 790 that may be similar to electronic packages 700, 760, 775, 785 and 787 illustrated in FIGS. 7A, 7B, 7C, 7D and 7E, respectively, however as compared to package 785 of FIG. 7D, in this embodiment there is no driver/control device 710. Any or all of the features of driver/control device 710 described above can be integrated within controller 765. In this particular embodiment GaN-based power transistor 780 includes a current sense circuit so source 720 is coupled to die attach pad 715.

Figure 8:
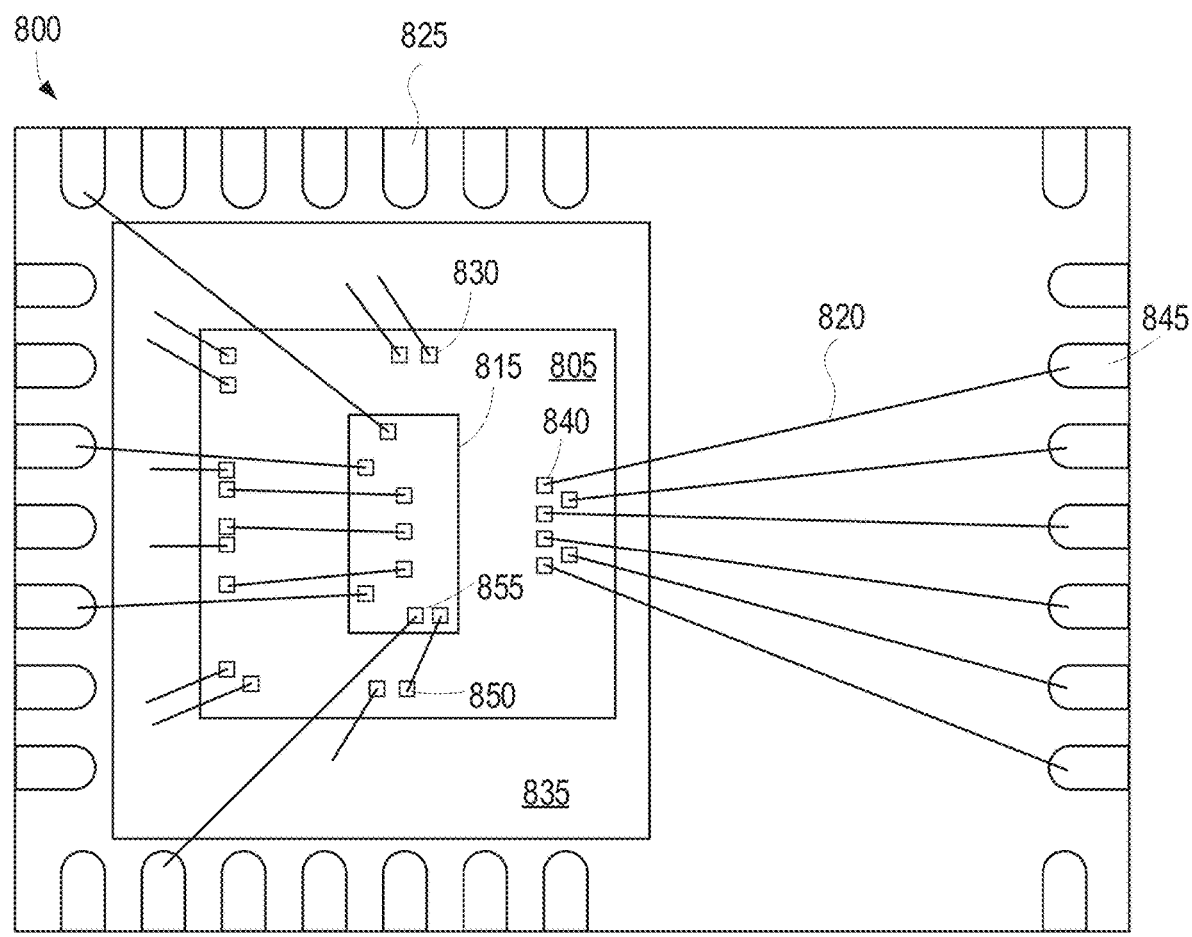
FIG. 8 is a transparent plan view of an electronic package with the encapsulant removed, according to a stacked die single switch embodiment of the invention.

FIG. 8 illustrates a transparent plan view of an electronic package 800, according to embodiments of the disclosure. As shown in FIG. 8, electronic package 800 can be fabricated using a quad-flat no lead (QFN) manufacturing process and can be similar to package 700 shown in FIG. 7, however in package 800 a GaN-based power transistor 805 is attached to die attach pad 835 and a silicon-based driver/control device 815 is attached to a top surface of the GaN-based power transistor. In some embodiments silicon-based driver/control device 815 is attached to GaN-based power transistor 805 using a non-electrically conductive adhesive and one or more wirebonds 820 can be used to electrically couple signals between the devices and terminals 825. In other embodiments silicon-based driver/control device 815 can be a flip-chip configuration that is flipped upside down and attached to GaN-based power transistor 805 using one or more electrically conductive solder balls, columns, pads, electrically conductive epoxy dots or other type of die to die interconnect structures. In this particular embodiment, GaN-based power transistor 805 can include any or all of a GaN-based power transistor, a current sense circuit and one or more portions of a driver circuit for the power transistor. The silicon-based driver/control device 815 may contain a temperature detection and over-temperature protection circuit. In this embodiment, placement of device 815 on the GaN-based transistor 805 can allow more direct measurement of the die surface temperature and allow a more accurate and faster responding temperature protection.

GaN-based power transistor 805 includes a source 830 coupled to a die attach pad 835, a drain 840 coupled to one or more train terminals 845 and a gate 850 connected to silicon-based driver/control device 815 via wirebonds 820. In this embodiment, because there is an internal current sense circuit, source 830 of GaN-based power transistor 805 can be electrically coupled to die attach pad 835 without negatively affecting a thermal resistance between package 800 and a circuit board to which it is attached, as described above. Silicon-based driver/control device 815 can include one or more I/O connections 855 that are coupled to terminals 825 via wirebonds 820. In some embodiments one of the one or more I/O connections 855 is a current sense output, as described above. In some embodiments the current sense circuit can be similar to current sense circuit 600 described in FIG. 6, however in other embodiments a different type of current sense circuit can be used. In one embodiment at least a portion of the current sense circuit can be integrated in silicon-based driver/control device 815 such that the silicon-based device transmits a ratioed current sense signal at an I/O terminal 825 of package 800.

In some embodiments driver/control device 815 can have similar features and operation as driver/control device 710 illustrated and described in FIGS. 7A-7D. In further embodiments electronic package 800 can include a separate controller (such as controller 765 illustrated in FIGS. 7B-7D) and/or a startup transistor (such as startup transistor 770 illustrated in FIG. 7B). In yet further embodiments GaN-based power transistor 805 can include a GaN-based startup transistor (similar to that described in FIG. 7C) and/or a pull-down device. Any of the devices and/or features described in FIGS. 7A-7D can be employed in electronic package 800.

Figure 9:
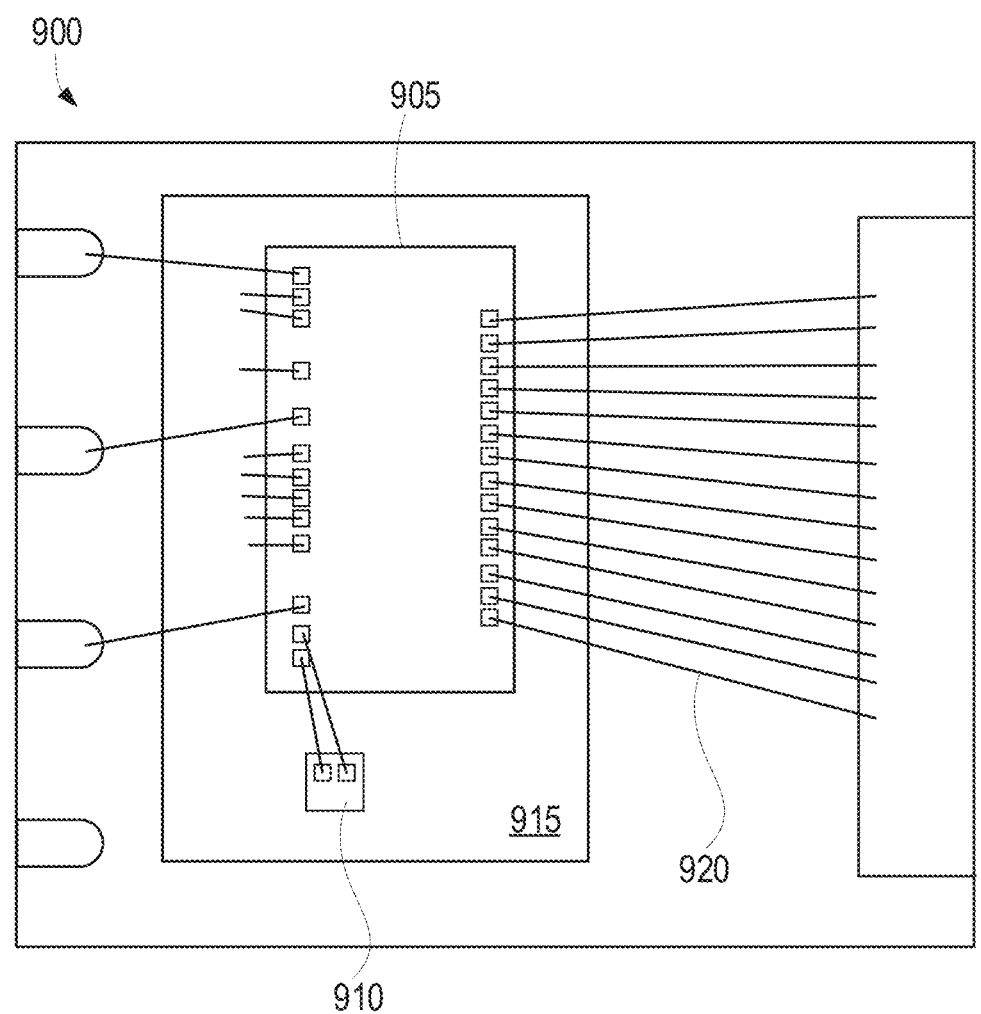
FIG. 9 is a transparent plan view of an electronic package with the encapsulant removed, according to a single switch with an internal Zener reference embodiment of the invention.

FIG. 9 illustrates a transparent plan view of an electronic package 900, according to embodiments of the disclosure.

As shown in FIG. 9, electronic package 900 can be fabricated using a quad-flat no lead (QFN) manufacturing process and can be similar to package 200 illustrated in FIGS. 2-3, however in this embodiment package 900 includes an integrated GaN-based power transistor 905 and a Zener diode 910 attached to die attach pad 915. In some embodiments a breakdown voltage of Zener diode 910 can be used as a reference by an internal voltage regulator circuit on integrated GaN power transistor 905 that replicates its voltage on a gate of the power transistor.

By placing Zener diode 910 within package 900 the Zener diode can be isolated from EMI noise outside of the package which can cause the voltage regulator to go out of regulation, or cause other circuit issues. In some embodiments Zener diode 910 can be a relatively high impedance device to minimize the amount of current drawn through it to maintain the breakdown voltage as a voltage reference.

In some embodiments Zener diode 910 can be attached on a separate pad within package 900 and in one embodiment it can be attached to a top surface of integrated GaN-based power transistor 905. Electrical interconnects can be formed with wirebonds 920, flip-chip interconnects or any other suitable method. Any of the devices and/or features described in FIGS. 7A-7D can be employed in electronic package 900.

Figure 10A:
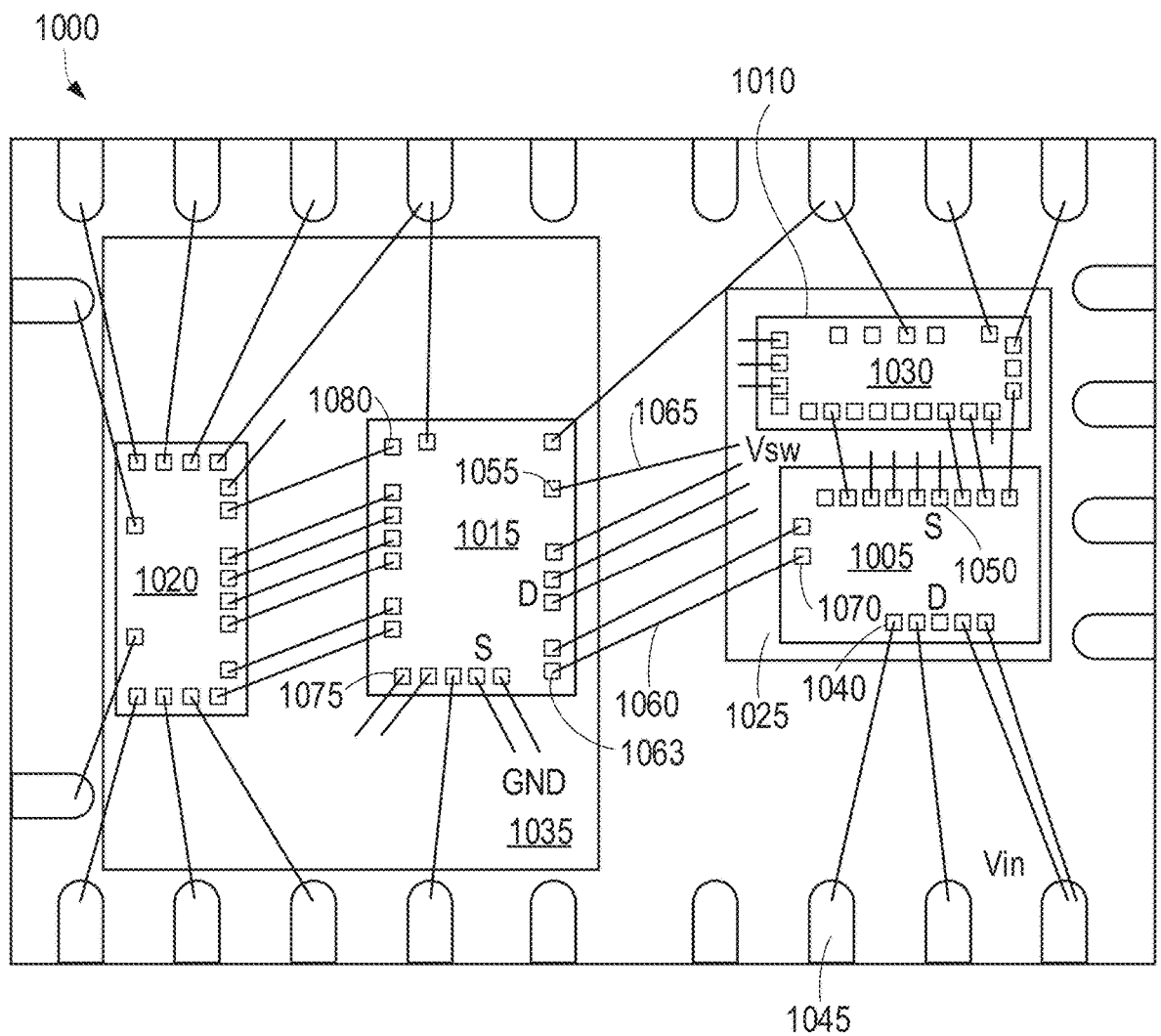
FIG. 10A is a transparent plan view of an electronic package with the encapsulant removed, according to a half bridge embodiment of the invention.

FIG. 10A illustrates a transparent plan view of an electronic package 1000, according to embodiments of the disclosure. As shown in FIG. 10A, electronic package 1000 can be fabricated using a quad-flat no lead (QFN) manufacturing process and can be similar to package 700 in FIG. 7 which included silicon-based die co-packaged with GaN-based transistor, however in electronic package 1000 a high side GaN-based transistor 1005 is attached to a high side die attach pad 1025 adjacent a silicon-based high side driver/control die 1030. Similarly, a low side GaN-based transistor die 1015 is attached to a low side die attach pad 1035 adjacent a silicon-based low side driver/control die 1020. Thus in this embodiment four separate dies are integrated into a single electronic package 1000. In another embodiment that can be similar to the configuration shown in FIG. 8, silicon-based high side driver/control die 1030 can be stacked on high side GaN-based transistor die 1005 and/or silicon-based low side driver/control die 1020 can be stacked on low side GaN-based transistor die 1015. In some embodiments die stacking can enable larger GaN-based dies for the same package size resulting in higher power handling capability and/or improved efficiency.

High side GaN-based transistor die 1005 is attached to high side die attach pad 1025 and includes a high side transistor (not shown in FIG. 10A) including a drain 1040 that is coupled to one or more input power terminals 1045. The high side transistor also includes a source 1050 that is coupled to a drain 1055 of a low side transistor (not shown in FIG. 10A) via high side die attach pad 1025 though wirebonds 1065. High side GaN-based transistor die 1005 can also include a receiver circuit (not shown) that is configured to receive a level-shifted signal and in response control a gate drive circuit that controls a gate of the low side transistor. A receiver circuit contact 1070 is electrically coupled to level shift output contact 1063 to carry the level-shifted signal.

In some embodiments low side GaN-based transistor die 1005 includes a level shifter circuit (not shown in FIG. 10A) that transmits the level-shifted signal via level shift output contact 1063. The level shifter circuit can be driven in response to one or more inputs to low side driver/control die 1020, such as a PWM input from a separate control die. Low side GaN-based transistor die 1015 further includes a low side transistor having a source 1075 that is coupled low side die attach pad 1035, and a gate 1080 that is coupled to low side driver/control die 1020. Drain 1055 is coupled to source 1050 through high side die attach pad 1025 and/or directly to source 1050. Low side and high side driver/control dies 1020, 1030, respectively, can have other I/O, such as a ratioed current sense output signal, that are coupled to terminals 1045. Other embodiments can have different configurations and die connections as described herein and as would be appreciated by one of skill in the art having the benefit of this disclosure.

Figure 10B:
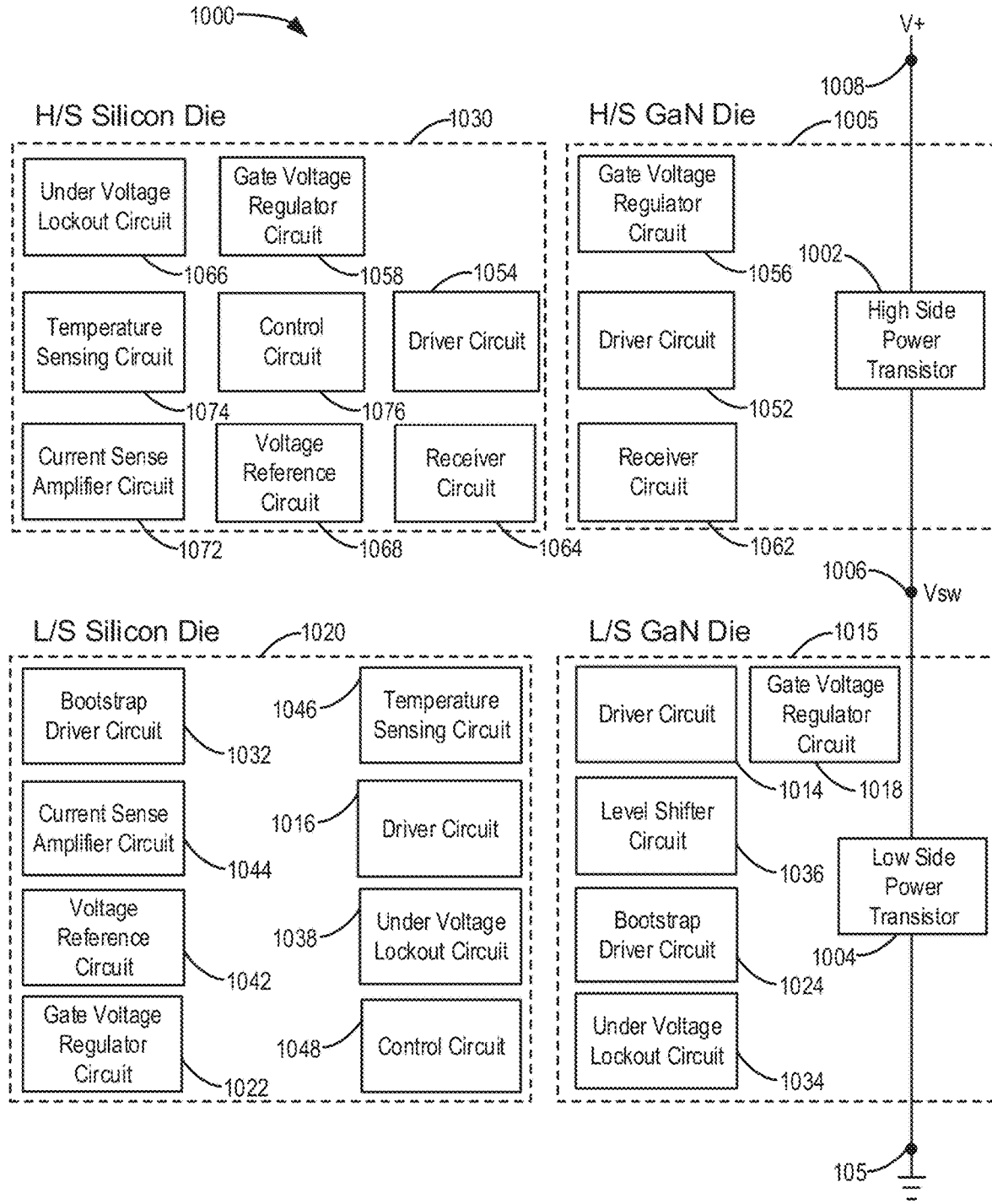
FIG. 10B illustrates a simplified functional block diagram of the electronic package illustrated in FIG. 10A.

FIG. 10B illustrates a simplified functional block diagram of electronic package 1000 shown in FIG. 10A. As shown in FIG. 10B, electronic package can include four separate die including a high side GaN-based die 1005, a low side GaN-based die 1015, a high side silicon-based die 1030 and a low side silicon-based die 1020. Each die can have various features, some of which are illustrated in FIG. 10B and described herein, however this description in no way limits the features each die can have. As shown in FIG. 10B, high side GaN-based die 1005 can include a high side power transistor 1002 that is electrically coupled to low side power transistor 1004 defining a switch node 1006 therebetween.

In some embodiments electronic package 1000 is suited for use in half-bridge applications. High side power transistor 1002 can be coupled to input voltage 1008 and low side power transistor 1004 can be coupled to ground 1012. In some embodiments low side GaN-based die 1015 can include a low side driver circuit 1014 that can drive a gate of low side power transistor 1004. However, in other embodiments low side silicon-based die 1020 can include a low side silicon-based driver circuit 1016 for driving the gate of low side power transistor 1004. In some embodiments low side GaN-based die 1015 can include a gate voltage regulator circuit 1018 for supplying power to driver circuit 1014. However, in other embodiments low side silicon-based die 1020 can include gate voltage regulator circuit 1022 for regulating voltage supplied to silicon-based driver circuit 1016 or to driver circuit 1014.

In some embodiments low side GaN-based die 1015 can include at least a portion of a bootstrap circuit 1024 that can be used to generate high-side bias to drive the gate of high-side power transistor 1002. The basic components of bootstrap circuit 1024 include a capacitor, a diode, a resistor and often a bypass capacitor. In some embodiments the diode can be formed on the low side GaN-based die 1015, however in other embodiments additional components can also be formed on the low side GaN-based die. In some embodiments, low side silicon-based die 1020 can include at least a portion of a bootstrap driver circuit 1032 as described above.

In some embodiments low side GaN-based die 1015 can include an under voltage lockout circuit 1034 that can disable one or more features of electronic package 1000 in response to detecting an input voltage that is below a threshold voltage. In one embodiment the input voltage is a VDD input voltage and under voltage lockout circuit 1034 responds by forcing low side power transistor 1004 in an off state and/or forcing high side power transistor 1002 in an off state. In some embodiments low side silicon-based die 1020 can have an under voltage lockout circuit 1038 that can also disable one or more features of electronic package 1000 in response to detecting an input voltage that is below a threshold voltage, as described in more detail above. In some embodiments low side GaN-based die 1015 can include a level shifter circuit 1036 that transmits a signal causing a gate of high side power transistor 1002 to turn on and/or turn off.

In some embodiments low side silicon-based die 1020 can include a voltage reference circuit 1042 that can be used by under voltage lockout circuit 1038 or any other circuit to provide one or more reference voltages that can be used for comparator and/or logic operations of low side silicon-based die 1020 and/or low side GaN-based die 1015. In some embodiments, low side silicon-based die 1020 can include a current sense amplifier circuit 1044 that can receive a sensed current signal related to a current flowing through low side power transistor 1004 and amplify the signal so it can be transmitted to a receiver circuit. In some embodiments low side silicon-based die 1020 can include a temperature sensing circuit 1046 that can sense a temperature of low side power transistor 1004 and/or low side silicon-based die 1020 and generate a signal corresponding to the sensed temperature.

In some embodiments temperature sensing circuit 1046 can also control operation of low side power transistor 1004 and/or high side power transistor 1002 to cease operation if the sensed temperature exceeds a threshold temperature. In some embodiments low side silicon-based die 1020 can include a control circuit 1048 that can include any suitable configuration of logic and/or control circuits that can be used by any circuits within low side silicon-based die 1020 or electronic package 1000.

In some embodiments high side GaN-based die 1005 can include a driver circuit 1052 that can drive a gate of high side power transistor 1002. However, in other embodiments high side silicon-based die 1030 can include a high side silicon-based driver circuit 1054 for driving the gate of high side power transistor 1002. In some embodiments high side GaN-based die 1005 can include a gate voltage regulator circuit 1056 for supplying power to driver circuit 1052. However, in other embodiments high side silicon-based die 1030 can include gate voltage regulator circuit 1058 for regulating voltage supplied to silicon-based driver circuit 1054 or to driver circuit 1052. In some embodiments, high side GaN-based die 1005 can include a receiver circuit 1062 configured to receive a level shift signal from level shifter circuit 1036 to operate a gate of high side power transistor 1002. In other embodiments, high side silicon-based die 1030 can include receiver circuit 1064 configured to receive a level shift signal from level shifter circuit 1036 to operate a gate of high side power transistor 1002.

In some embodiments high side silicon-based die 1030 can include an under voltage lockout circuit 1066 that can disable one or more features of electronic package 1000 in response to detecting an input voltage that is below a threshold voltage. In one embodiment the input voltage is a VDD input voltage and under voltage lockout circuit 1066 responds by forcing low side power transistor 1004 into an off state and/or forcing high side power transistor 1002 into an off state.

In some embodiments high side silicon-based die 1030 can include a voltage reference circuit 1068 that can be used by under voltage lockout circuit 1066 or any other circuit to provide one or more reference voltages that can be used for comparator and/or logic operations of high side silicon-based die 1030 and/or high side GaN-based die 1005. In some embodiments, high side silicon-based die 1030 can include a current sense amplifier circuit 1072 that can receive a sensed current signal related to a current flowing through high side power transistor 1002 and amplify the signal so it can be transmitted to a receiver circuit. In some embodiments high side silicon-based die 1030 can include a temperature sensing circuit 1074 that can sense a temperature of high side power transistor 1005 and/or high side silicon-based die 1030 and generate a signal corresponding to the sensed temperature.

In some embodiments temperature sensing circuit 1074 can also control operation of high side power transistor 1005 and/or low side power transistor 1015 to cease operation if the sensed temperature exceeds a threshold temperature. In some embodiments high side silicon-based die 1030 can include a control circuit 1076 that can include any suitable configuration of logic and/or control circuits that can be used by any circuits within high side silicon-based die 1030 or electronic package 1000.

In some embodiments high side GaN-based transistor die 1005 and/or low side GaN-based transistor die 1015 can include a power field-effect transistor (FET) and a pull-down transistor that is coupled to the respective power transistor 1002, 1004 for each die. In further embodiments other circuits can be included in electronic package 1000 as would be appreciated by one of skill in the art having the benefit of this disclosure, including but not limited to a high voltage diode-connected FET for short circuit detection, dv/dt detector circuits, and an external Zener diode reference circuit.

Any of the circuits and/or functions described with regard to FIGS. 10A and 10B can be communicatively coupled together, combined or partitioned differently than shown in FIGS. 10B and 10B. For example, in one embodiment one or more functions of high side silicon-based die 1030 and one or more functions of low side silicon-based die 1020 can be combined into a single silicon-based die so electronic package 1000 has two GaN-based die and one silicon-based die.

In some embodiments that include both low side GaN-based transistor 1015 and low side silicon-based driver/control die 1020 attached to a common low side die attach pad 1035, the low side silicon-based driver/control die can accurately detect a temperature of the low side GaN-based transistor, can have improved noise immunity from switching noise, can generate accurate power supply rails, can accurately detect under voltage lockout triggers, can accurately detect current flow and can have improved shoot-through protection. Further, with regard to driver circuitry, the gate drive signal can be transmitted to low side GaN-based transistor 1015 with increased speed and accuracy due to the short interconnect distance between the dies resulting in reduced parasitic capacitance and inductance. Similar benefits can be realized by attaching high side GaN-based transistor 1005 and silicon-based high side driver/control die 1030 to a common high side die attach pad 1025.

In another embodiment of an electronic package that includes one silicon-based device and one GaN-based device wherein the silicon based device can include a voltage reference circuit, a Vdd regulator circuit, a current sense amplifier circuit, a gate drive logic circuit, a short circuit protection logic circuit, an over-temperature protection circuit, an under-voltage lockout circuit, a gate drive minus pulldown circuit and/or a pulldown driver circuit. The GaN-based device can include a power transistor circuit, a pulldown FET circuit, high voltage diode-connected FET for short circuit detection and/or a dv/dt detect circuit for adaptive deadtime.

In some embodiments high side silicon-based die 1030 has circuitry on it that is referenced to the high side source. In one embodiment the high side silicon-based die is a high voltage IC with a floating well to include high side circuitry. In other embodiments, both the low side silicon—based die and the high side silicon-based die are low voltage devices, and the high voltage functions such as level shift, bootstrap, de-sat, and startup circuits are in the high and/or low side GaN based transistors 1030, 1020, respectively.

In some embodiments an electronic package includes a GaN-based device with a specific pinout to enable paralleling on a single layer insulated metal substrate. In one embodiment the gate of the GaN-based device is coupled to a terminal of the package so that gates of two separate electronic packages can be tied together by a resistor. This configuration may assist compensating for any timing mismatch in the drivers of the two GaN-based devices, as the PWM inputs may also be tied together. In some embodiments an external current sense resistor is coupled between an I/O terminal and the die attach pad.

In some embodiments driver/control devices 1020, 1030 can have similar features and operation as driver/control device 710 illustrated and described in FIGS. 7A-7D. In further embodiments electronic package 1000 can include a separate controller (such as controller 765 illustrated in FIGS. 7B-7D) and/or a startup transistor (such as startup transistor 770 illustrated in FIG. 7B). In yet further embodiments GaN-based power transistor 1005,1015 can include a GaN-based startup transistor (similar to that described in FIG. 7C) and/or a pull-down device. Any of the devices and/or features described in FIGS. 7A-7D can be employed in electronic package 1000.

In some embodiments package types other than QFN can be used in accordance with the embodiments described herein. In various embodiments a multi-chip module (MCM) that includes a multilayer substrate made from a circuit board or other material can be used. In further embodiments a sealed chip on board (SCOB) device, quad flat pack (QFP), small outline IC (SOIC) package, D2-PAK (e.g., TO-263), over-molded package or any other suitable electronic package can be used.

The components, circuit layout, circuit functionality, type of interconnect, physical arrangement of semiconductor devices, etc. shown herein are for example only and variants are within the scope of this disclosure.

In one embodiment creepage spacing, such as creepage spacing 255 in FIG. 2B can be varied depending on the voltage and reliability needs of the application. In one embodiment creepage spacing is between 0.6 millimeters and 2 millimeters, while in another embodiment it is between 0.8 millimeters and 1.2 millimeters, and in one embodiment it is are at least 1.0 millimeters. In another embodiment creepage spacing 255 is between 0.8 millimeters and 3 millimeters, while in another embodiment it is between 1.8 millimeters and 2.8 millimeters, and in one embodiment it is at least 1.5 millimeters. In a further embodiment creepage spacing 255 is between 0.8 millimeters and 3 millimeters, while in another embodiment it is between 1.8 millimeters and 2.8 millimeters, and in one embodiment it is at least 2.0 millimeters.

In some embodiments, low side transistor 110 (see FIGS. 1-10) and/or high side transistor 115 may be GaN-based enhancement-mode field effect transistors (FET). In other embodiments low side transistor 110 and high side transistor 115 may be any other types of devices including, but not limited to, GaN-based depletion-mode transistors, GaN-based depletion-mode transistors connected in series with silicon based enhancement-mode field-effect transistors having the gate of the depletion-mode transistor connected to the source of the silicon-based enhancement-mode transistor, silicon carbide based transistors or silicon-based transistors.

In some embodiments low side transistor 110 and high side transistor 115 may be made from a GaN-based material. In one embodiment the GaN-based material may include a layer of GaN on a layer of silicon. In further embodiments the GaN based material may include, but not limited to, a layer of GaN on a layer of silicon carbide, sapphire or aluminum nitride. In one embodiment the GaN based layer may include, but not limited to, a composite stack of other III nitrides such as aluminum nitride and indium nitride and III nitride alloys such as AlGaN and InGaN.

As discussed above, in some embodiments package base 205 (see FIG. 2A) may comprise a leadframe that may include copper while in other embodiments other types of metals may be used, including metal alloys. In further embodiments the leadframe may be a part of a larger leadframe that may be subsequently singulated into multiple electronic packages 200, as discussed in more detail below. In one embodiment the leadframe may be between 50 microns and 250 microns thick. In further embodiments package base 205 may be between 100 and 200 microns thick while in another embodiment it may be approximately 150 microns thick. In other embodiments package base 205 (see FIG. 2A) may be a printed circuit board as known by those of skill in the art and may have one or more layers of circuit routing.

In some embodiments encapsulant 250 (see FIG. 3) may be a dielectric polymer-based material and may have one or more solid fillers such as, but not limited to silica, aluminum-oxide or aluminum nitride. In further embodiments the polymer may be a thermosetting epoxy, polyimide or polyurethane. In other embodiments the polymer may be a thermoplastic material such as, but not limited to polyphenylene sulfide or liquid crystal polymer.

In some embodiments electronic packages described herein may be configured for use in high voltage applications where a leakage path along the surface of the encapsulant may be configured to meet reliability and performance requirements. In some embodiments, a substrate can be used as a package base and may be made of a high dielectric material such as, but not limited to a ceramic or an organic material. In one embodiment the substrate may be made from aluminum oxide and have metallization on a top and a bottom surface. A high dielectric material such as aluminum oxide may be used to achieve the required dielectric withstanding voltage between the switch node and ground while keeping the substrate relatively thin.

In further embodiments the substrate may be made of a relatively high thermal conductivity material such as, but not limited to aluminum nitride, or silicon nitride and may provide an efficient thermal path from one or more transistors to a circuit board to which the package is attached.

In some embodiments electronic packages as described herein may have external dimensions of 5 millimeters by 6 millimeters while in other embodiments they may have external dimensions of 6 millimeters by 8 millimeters and a 0.65 millimeter terminal pitch. In another embodiment electronic package may have external dimensions of 8 millimeters by 8 millimeters, while other embodiments can have other suitable external dimensions.

In some embodiments devices described herein as GaN based may include a first layer that can include silicon, silicon carbide, sapphire, aluminum nitride or other material. A second layer is disposed on the first layer and can include gallium nitride or other material. A third layer can be disposed on the second layer and can include a composite stack of other III nitrides such as, but not limited to, aluminum nitride, indium nitride and III nitride alloys such as aluminum gallium nitride and indium gallium nitride. In one embodiment the third layer is $Al_{0.20}Ga_{0.80}N$. In further embodiments any other suitable compound semiconductor material can be used.

Example QFN Manufacturing Process

Figure 11:
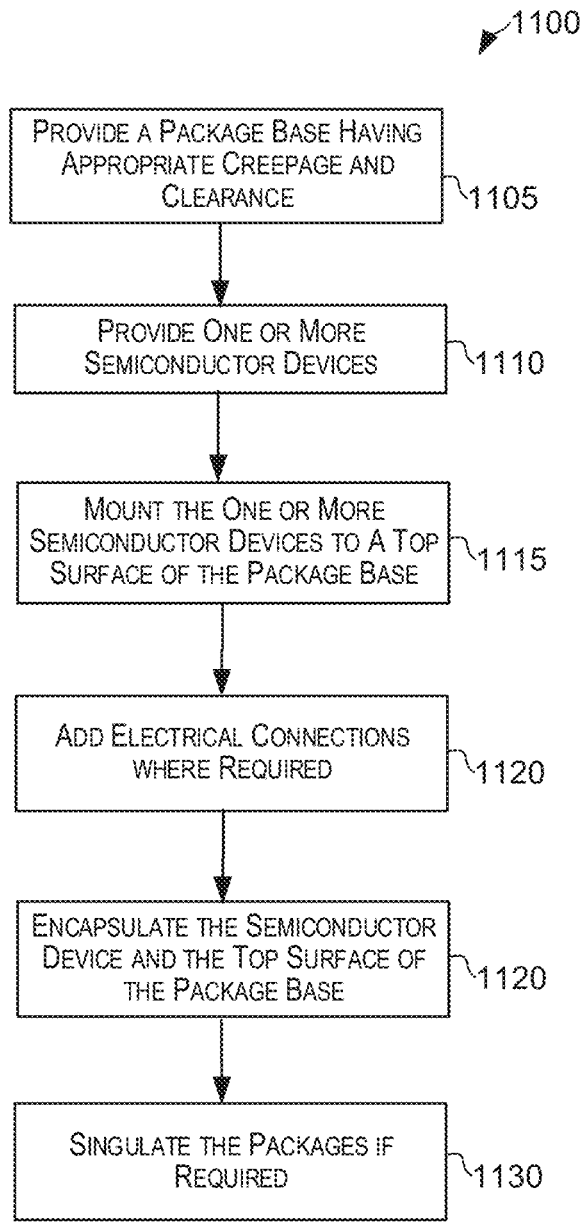
FIG. 11 is method of manufacturing an electronic package according to an embodiment of the invention.

Now referring to FIG. 11 an example QFN manufacturing process 1100 is illustrated. Manufacturing process 1100 is for example only and other electronic package manufacturing processes may be used without departing from the invention.

In one embodiment the QFN manufacturing process may include a substrate that may comprise electrically conductive portions is used to form a package base on which one or more semiconductor dies are mounted and electrically coupled to. Portions of the substrate may form one or more external electrical connections and a dielectric encapsulant may be formed on at least a top surface of the substrate and around the one or more semiconductor dies, as discussed in more detail below.

Now referring to step 1105 of FIG. 11 a package base having appropriate creepage and clearance is provided. In some embodiments package base may be a metallic leadframe. In some embodiments the leadframe may comprise copper while in other embodiments other types of metals may be used, including alloys. In other embodiments the package base may be a printed circuit board having one or more layers of electrical routing. In further embodiments the leadframe or printed circuit board may be a part of a larger panel that may be subsequently singulated into multiple singular electronic packages. In one embodiment the package base may be between 50 microns and 1 millimeter thick. In further embodiments the package base may be between 100 microns 750 microns thick while in another embodiment it may be between 150 microns and 500 microns thick.

In some embodiments the package base is equipped with the appropriate creepage and clearance distances between pads of different voltage potentials as required by the application. In some embodiments the creepage and clearance distances may be between 0.5 millimeter and 4 millimeters while in further embodiments they may be between 1 millimeters and 3 millimeters and in further embodiments may be between 2 and 3 millimeters.

Now referring to step 1110 of FIG. 11 one or more semiconductor devices are provided. As discussed above, in some embodiments the one or more semiconductor devices may be GaN-based devices and/or silicon-based devices. In further embodiments the one or more GaN-based devices may have a plurality of source pads separated by a plurality of drain pads by 1 millimeter or less.

Now referring to step 1115 of FIG. 11 the one or more semiconductor devices are mounted to top surface the package base. In some embodiments the one or more semiconductor devices may have a metalized back surface that is soldered to the package base while in other embodiments they may be glued with an adhesive that may or may not be electrically conductive. In some embodiments one or more dies can be stacked on the dies attached to the package base. The stacked dies can be attached "face up" or "face down" which may also be called a "flip chip". In some embodiments an interposer substrate can be attached to the die attach pad first, followed by one or more dies attached to the interposer substrate. In one embodiment the interposer substrate is an insulated metal substrate (IMS) that can include one or more metallized surfaces of a ceramic layer.

Now referring to step 1120 of FIG. 11 electrical connections may be added to electrically couple the one or more semiconductor devices to the package base and/or to each other. In one embodiment wirebonds may be used that comprise gold, silver, copper or aluminum. In another embodiment other interconnect methods may be used such as metallic clips and other electrically conductive substances. In further embodiments with flip chip dies solder balls, columns, conductive epoxy or other interconnects can be used.

Now referring to step 1125 in FIG. 11 the one or more semiconductor devices and at least a top surface of the package base are encapsulated with an encapsulant material. The encapsulant material has a thickness that extends from top surface of the package base to a top surface of the semiconductor package such that the active areas of the semiconductor device and the electrical interconnects may be protected from the environment. In some embodiments the encapsulant material may extend into recesses or indentation features in the package base creating a substantially solid electronic package with few or no air voids. In some embodiments more than one semiconductor package that may be known as a "panel" may be encapsulated at the same time.

In some embodiments the encapsulant material may be a dielectric polymer-based material and may have one or more solid fillers such as, but not limited to silica, aluminum-oxide or aluminum nitride. In further embodiments the polymer may be a thermosetting epoxy, polyimide or polyurethane. In other embodiments the polymer may be a thermoplastic material such as, but not limited to polyphenylene sulfide or liquid crystal polymer. In some embodiments encapsulant material may be disposed on the package base with a transfer molding process.

Now referring to step 1130 in FIG. 11 if more than one electronic package is fabricated in a panel format the packages are singulated. In some embodiments they may be sawn apart while in other embodiments they may be punch singulated and in further embodiments they may be laser cut.

For simplicity, various internal components, internal circuitry, and peripheral circuitry of electronic circuit 100 and package 200 (see FIGS. 1-3) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

What is claimed is:

1. An electronic device comprising:
a die-attach pad, at least one drain terminal, at least one source terminal and at least one gate terminal; and
a gallium nitride (GaN) semiconductor substrate including a transistor formed therein, the transistor including a gate, a drain and a source, wherein:
the GaN semiconductor substrate is electrically connected to the die-attach pad;
the gate is directly electrically connected to the at least one gate terminal;
the drain is directly electrically connected to the at least one drain terminal; and
the source is directly electrically connected to the at least one source terminal, wherein the at least one source terminal is directly electrically connected to one or more current sense resistors.

2. The electronic device of claim 1 wherein the die-attach pad is arranged to be coupled to a ground potential.

3. The electronic device of claim 1 wherein the die-attach pad, the at least one drain terminal, the at least one source terminal and the at least one gate terminal are electrically isolated from each other.

4. The electronic device of claim 1 wherein at least a portion of the GaN semiconductor substrate is covered by an encapsulant.

5. The electronic device of claim 4 wherein the encapsulant covers at least a portion of the die-attach pad, the at least one gate terminal, the at least one drain terminal and the at least one source terminal.

6. The electronic device of claim 1 wherein the at least one source terminal is directly electrically coupled to the one or more current sense resistors via wirebonds, metallic clips, vias, or conductive epoxy.

7. The electronic device of claim 1 wherein the GaN semiconductor substrate includes one or more layers of GaN formed on a layer of silicon.

8. A device comprising:
at least one die-attach terminal, at least one drain terminal, at least one source terminal and at least one gate terminal; and
a gallium nitride (GaN) semiconductor substrate including at least one transistor having at least one gate, at least one drain and at least one source, wherein:
the GaN semiconductor substrate is electrically and physically connected to the at least one die-attach terminal;
the at least one gate is directly electrically connected to the at least one gate terminal;
the at least one drain is directly electrically connected to the at least one drain terminal; and
the at least one source is directly electrically connected to the at least one source terminal and is directly electrically connected to one or more current sense resistors.

9. The device of claim 8 wherein the at least one die-attach terminal is arranged to be connected to a ground potential.

10. The device of claim 8 wherein the at least one die-attach terminal, the at least one drain terminal, the at least one source terminal and the at least one gate terminal are electrically isolated from each other.

11. The device of claim 8 further comprising an encapsulant that covers at least a portion of the GaN substrate.

12. The device of claim 11 wherein the encapsulant covers at least a portion of the at least one die-attach terminal, the at least one drain terminal, and the at least one source terminal.

13. The device of claim 8 wherein the at least one source terminal is directly electrically coupled to the one or more current sense resistors via wirebonds, metallic clips, vias, or conductive epoxy.

14. The device of claim 8 wherein the GaN semiconductor substrate includes one or more layers of GaN formed on a layer of silicon.

15. An electronic package comprising:
a plurality of external terminals including a ground terminal, a drain terminal, a source terminal and a gate terminal; and
a gallium nitride (GaN) die including at least one transistor having a drain contact, a source contact and a gate contact, the GaN die electrically and physically connected to the ground terminal, wherein the drain contact is directly electrically coupled to the drain terminal, the source contact is directly electrically coupled to the source terminal and the gate contact is directly electrically coupled to the gate terminal, and wherein the source terminal is directly electrically coupled to one or more current sense resistors; and
an encapsulant disposed between each of the plurality of external terminals.

16. The electronic package of claim 15 wherein the ground terminal is arranged to be connected to a ground potential.

17. The electronic package of claim 15 wherein the ground terminal, the drain terminal, the source terminal and the gate terminal are electrically isolated from each other.

18. The electronic package of claim 15 wherein the encapsulant covers at least a portion of the GaN die.

19. The electronic package of claim 15 wherein the source terminal is directly electrically coupled to the one or more current sense resistors via wirebonds, metallic clips, vias, or conductive epoxy.

20. The electronic package of claim 15 wherein the GaN die includes one or more layers of GaN formed on a layer of silicon.

* * * * *